United States Patent
You

(10) Patent No.: US 11,605,433 B2
(45) Date of Patent: Mar. 14, 2023

(54) STORAGE DEVICE AND METHOD OF OPERATING THE SAME

(71) Applicant: SK hynix Inc., Icheon-si (KR)

(72) Inventor: Byoung Sung You, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 123 days.

(21) Appl. No.: 17/190,226

(22) Filed: Mar. 2, 2021

(65) Prior Publication Data
US 2022/0068392 A1 Mar. 3, 2022

(30) Foreign Application Priority Data

Aug. 31, 2020 (KR) .......................... 10-2020-0110522

(51) Int. Cl.
| | | |
|---|---|---|
| *G11C 11/00* | (2006.01) | |
| *G11C 16/10* | (2006.01) | |
| *G11C 16/04* | (2006.01) | |
| *G06F 3/06* | (2006.01) | |
| *G11C 11/56* | (2006.01) | |

(52) U.S. Cl.
CPC ............ *G11C 16/10* (2013.01); *G06F 3/0604* (2013.01); *G06F 3/0659* (2013.01); *G06F 3/0673* (2013.01); *G11C 16/0483* (2013.01); *G11C 11/5671* (2013.01)

(58) Field of Classification Search
CPC .. G11C 16/10; G11C 16/0483; G11C 11/5671
See application file for complete search history.

(56) References Cited

U.S. PATENT DOCUMENTS

| | | | | |
|---|---|---|---|---|
| 11,360,886 B2* | 6/2022 | Byun | .................. | G06F 9/30047 |
| 2013/0159785 A1* | 6/2013 | Hashimoto | ............ | G11C 29/42 |
| | | | | 714/47.2 |
| 2016/0322110 A1* | 11/2016 | Abiko | .................... | G11C 7/106 |

FOREIGN PATENT DOCUMENTS

| | | |
|---|---|---|
| KR | 100684873 B1 | 2/2007 |
| KR | 1020180060370 A | 6/2018 |

* cited by examiner

*Primary Examiner* — Pho M Luu
(74) *Attorney, Agent, or Firm* — William Park & Associates Ltd.

(57) ABSTRACT

A storage device includes a memory device including a plurality of memory blocks including a plurality of memory cells respectively connected to a plurality of word lines which are vertically stacked, and a memory controller configured to control the memory device to determine an attribute of a plurality of write data corresponding to a write request in response to the write request provided from a host, set a program voltage used for a program operation of storing write data having the same attribute of the write data among the plurality of write data in the same memory block based on a lookup table including the attribute of the write data and program information on the program voltage according to positions of the plurality of word lines, and perform the program operation according to the set program voltage.

20 Claims, 16 Drawing Sheets

| PAGE | HOT COLD WARM | EW Cycle | DATA | CRC | LDPC Parity |

Seed Data — User Data

FIG. 11

| LUT1 | | | |
|---|---|---|---|
| Sum Count Reference Range | Range1_1 | Range1_2 | Range1_3 |
| Program Start Voltage | Vstart1_1 | Vstart1_2 | Vstart1_3 |
| ISPP Step Voltage | ΔV1_1 | ΔV1_2 | ΔV1_3 |

| LUT2 | | | |
|---|---|---|---|
| Sum Count Reference Range | Range2_1 | Range2_2 | Range2_3 |
| Program Start Voltage | Vstart2_1 | Vstart2_2 | Vstart2_3 |
| ISPP Step Voltage | ΔV2_1 | ΔV2_2 | ΔV2_3 |

| LUT3 | | | |
|---|---|---|---|
| Sum Count Reference Range | Range3_1 | Range3_2 | Range3_3 |
| Program Start Voltage | Vstart3_1 | Vstart3_2 | Vstart3_3 |
| ISPP Step Voltage | ΔV3_1 | ΔV3_2 | ΔV3_3 |

STORAGE DEVICE AND METHOD OF OPERATING THE SAME

CROSS-REFERENCE TO RELATED APPLICATION

The present application claims priority under 35 U.S.C. § 119(a) to Korean patent application number 10-2020-0110522, filed on Aug. 31, 2020, in the Korean intellectual Property Office, the entire disclosure of which is incorporated herein by reference.

BACKGROUND

1. Technical Field

The present disclosure relates to an electronic device, and more particularly, to a storage device and storage system including the storage device and a method of operating the storage device and storage system including the storage device.

2. Related Art

A storage device is a device that stores data under control of a host device. The storage device may include a memory device storing data and a memory controller controlling the memory device. The memory device may be classified into a volatile memory device and a non-volatile memory device.

The volatile memory device may store data only while receiving power from a power source. When the power supply is cut off, the data stored in the volatile memory device may be lost. The volatile memory device may include a static random access memory (SRAM), a dynamic random access memory (DRAM), and the like.

The non-volatile memory device may be a device in which the data is not lost even though power of the power source is cut off. The non-volatile memory device may include a read only memory (ROM), a programmable ROM (PROM), an electrically programmable ROM (EPROM), an electrically erasable and programmable ROM (EEPROM), a flash memory, and the like.

SUMMARY

A storage device according to an embodiment of the present disclosure may include a memory device including a plurality of memory blocks including a plurality of memory cells respectively connected to a plurality of word lines which are vertically stacked, and a memory controller configured to control the memory device to determine an attribute of a plurality of write data corresponding to a write request in response to the write request provided from a host, set a program voltage used for a program operation of storing write data having the same attribute of the write data among the plurality of write data in the same memory block based on a lookup table including the attribute of the write data and program information on the program voltage according to positions of the plurality of word lines, and perform the program operation according to the set program voltage.

A method of operating a storage device according to another embodiment of the present disclosure may include determining an attribute of write data corresponding to a write request in response to the write request provided from a host, determining a program voltage corresponding to the attribute of the write data based on a plurality of lookup tables including the attribute of the write data and program information on a program voltage according to positions of a plurality of word lines which are vertically stacked, and performing a program operation of storing the write data in a memory block including a plurality of memory cells respectively connected to the plurality of word lines according to the program voltage.

BRIEF DESCRIPTION OF THE DRAWINGS

FIG. 11 is a diagram illustrating a plurality of lookup tables generated for each of a plurality of word line groups.

DETAILED DESCRIPTION

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and the descriptions are not limited to the embodiments described in the present specification or application.

An embodiment of the present disclosure provides a storage device having improved performance by performing a less merge operation or garbage collection, and a method of operating the storage device.

According to the present technology, a storage device having improved performance by performing less merge operation or garbage collection, and a method of operating the storage device are provided.

Figure 1:
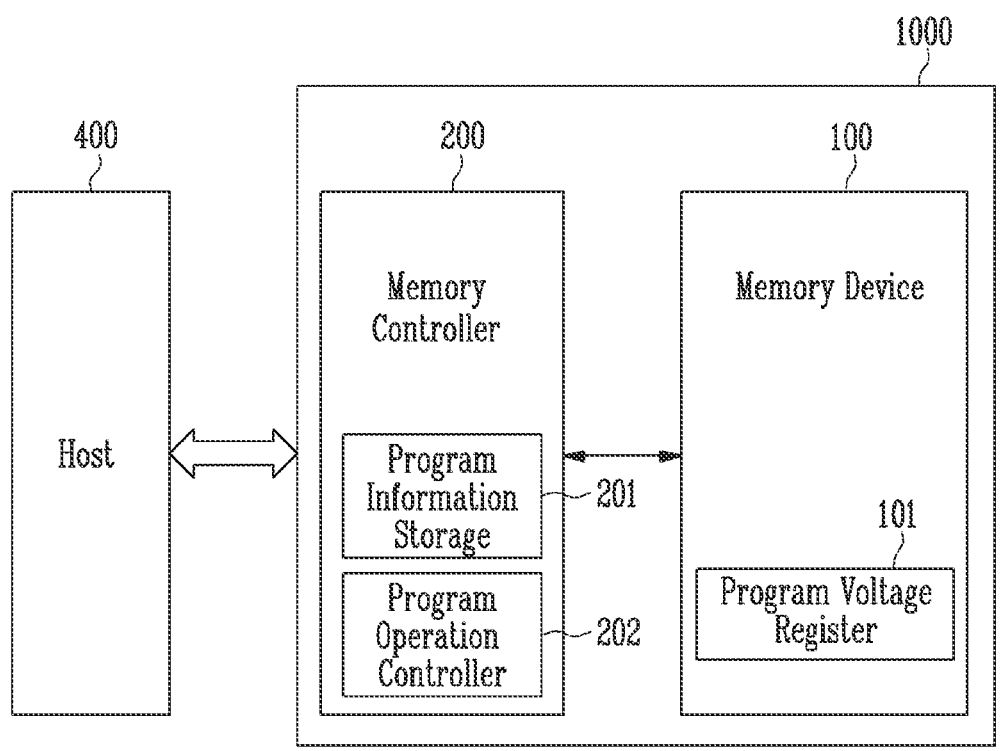
FIG. 1 is a diagram illustrating a storage system according to an embodiment of the present disclosure.

FIG. 1 is a diagram illustrating a storage system according to an embodiment of the present disclosure.

Referring to FIG. 1, the storage system may be implemented as a personal computer (PC), a data center, a corporate data storage system, a data processing system including a direct attached storage (DAS), a data processing system including a storage area network (SAN), and a data processing system including a network attached storage (NAS), or the like.

The storage system may include a storage device 1000 and a host 400.

The storage device 1000 may be a device that stores data according to a request of the host 400 such as a cellular phone, a smartphone, an MP3 player, a laptop computer, a desktop computer, a game player, a TV, a tablet PC, or an in-vehicle infotainment system.

The storage device 1000 may be manufactured as one of various types of storage devices according to a host interface that is a communication method with the host 400. For example, the storage device 1000 may be configured as any one of various types of storage devices such as an SSD, a multimedia card in a form of an MMC, an eMMC, an RS-MMC and a micro-MMC, a secure digital card in a form of an SD, a mini-SD and a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-E) card type storage device, a compact flash (CF) card, a smart media card, and a memory stick.

The storage device 1000 may be manufactured as any one of various types of packages. For example, the storage device 1000 may be manufactured as any one of various types of package types, such as a package on package (POP), a system in package (SIP), a system on chip (SOC), a mufti-chip package (MCP), a chip on board (COB), a wafer-level fabricated package (WFP), and a wafer-level stack package (WSP).

The storage device 1000 may include a memory device 100 and a memory controller 200.

The memory device 100 may operate in response to control of the memory controller 200. For example, the memory device 100 may receive a command and an addresses from the memory controller 200 and access a memory cell selected by the address among memory cells (not shown). The memory device 100 may perform an operation instructed by the command on the memory cell selected by the address.

The command may be, for example, a program command, a read command, or an erase command, and the operation instructed by the command may be, for example, a program operation (or a write operation), a read operation, or an erase operation.

For example, the memory device 100 may receive the program command, an address, and data, and program the data in a memory cell selected by the address. Here, data to be programmed in the selected memory cell may be defined as write data.

An attribute of the write data may be any one of hot data, warm data, and cold data.

The hot data may be data in which the number of times the host 400 accesses the write operation and the read operation is relatively frequent. Alternatively, the hot data may be data in which a size of write data or a size of a data chunk which is a set of a plurality of write data is relatively small. The hot data may be, for example, random data.

The cold data may be data in which the number of accesses of the host 400 is relatively rare. Alternatively, the cold data may be data in which the size of the write data or the size of the data chunk which is the set of the plurality of write data is relatively greater than the size of the write data corresponding to the hot data. The cold data may be, for example, sequential data, which is data corresponding to consecutive logical addresses among a plurality of logical addresses.

The warm data may be data in which the size of the write data is included in a range between the size of the write data corresponding to the hot data and size of the write data corresponding to the cold data. Alternatively, the warm data may be data having the number of accesses included in a range between the number of accesses corresponding to the hot data and the number of accesses corresponding to the cold data.

For example, the memory device 100 may receive the read command and an address, and read data from a region selected by the address in the memory cell array (not shown). Data to be read from the selected region among data stored in the memory device 100 may be defined as read data.

For example, the memory device 100 may receive the erase command and an address, and erase data stored in a region selected by the address.

For example, the memory device 100 may be implemented with a volatile memory device or a non-volatile memory device.

The volatile memory device may include a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), a resistive random access memory (RRAM), a magnetoresistive random access memory (MRAM), a ferroelectric random access memory, a spin transfer torque random access memory (STT-RAM), and the like.

The non-volatile memory device may include a NAND flash memory, a vertical NAND flash memory, a NOR flash memory, and the like.

In the present specification, for convenience of description, it is assumed that the memory device 100 is a NAND flash memory.

The memory device 100 may store the write data under control of the memory controller 200, or read the stored read data and provide the read data to the memory controller 200.

The memory device 100 may include at least one plane. One plane may include a memory cell array (not shown) including memory cells storing data.

The memory cell array may include a plurality of memory blocks (not shown). The memory block may be a unit that performs an erase operation of erasing data.

The memory block may include a plurality of pages (not shown). The page may be a unit that performs the program operation of storing the write data or the read operation of reading the stored read data.

The memory block may include a plurality of memory cells. The plurality of memory cells may have any one of an erase state or a plurality of program states as respective target states according to whether the program operation is performed. That is, one memory cell may be in any one of the erase state or the plurality of program states.

The program operation may be an operation of increasing threshold voltages of selected memory cells so that the respective threshold voltages of the selected memory cells among the plurality of memory cells are included in respective target states. The program operation may be performed in a page unit, A page may be a plurality of memory cells connected to the same word line.

The number of program states may be determined according to the number of bits of data stored in the memory cell. For example, the memory cell may be configured as any one of a single level cell (SLC) that stores one bit of data, a multi-level cell (MLC) that stores two bits of data, a triple level cell (TLC) that stores three bits of data, and a quadruple level cell (QLC) that stores four bits of data. However, the present disclosure is not limited thereto, and the memory cell may store five or more bits of data.

When the number of bits is a (a is a natural number), the number of the plurality of program states may be p. Here, p may be $2^a-1$. For example, since the memory cell configured as the SLC may be programmed to have any one of the erase state and a first program state, the number of program states of the SLC is one. Since the memory cells configured as the MLC may be programmed to have any one of the erase state and first to third program states, the number of program states of the MLC is three. Similarly, the number of program states of the TLC is seven and the number of program states of the QLC is fifteen.

The memory cell may have any one of the plurality of program states and the erase state as the target state. Here, the target state of each memory cell may be determined according to data to be stored in a corresponding memory cell. When the memory cell is the SLC, the target state may be any one of the erase state or the first program state. When the memory cell is the MLC, the target state may be any one of the erase state or first to third program states. When the memory cell is the TLC, the target state may be any one of the erase state or first to seventh program states. When the memory cell is the QLC, the target state may be any one of the erase state or the first to fifteenth program states.

The program operation may include a plurality of program loops. Each program loop may include a program voltage apply operation and a verify operation.

The program voltage apply operation may be an operation of applying the program voltage to a selected word line, which is a word line commonly connected to selected memory cells.

The verify operation may be an operation of determining whether the threshold voltage of the memory cell reaches a threshold voltage corresponding to the target state.

In the verify operation, a verify voltage for verifying the target state may be applied to the selected word line. When threshold voltages of a preset number of memory cells among memory cells having the same target state are greater than the verify voltage, the verify operation may be passed. When each of the threshold voltages of the preset number of memory cells among the memory cells having the same target state is equal to or less than the verify voltage, the verify operation may be failed.

When the verification for all target states is passed, it may be determined that the program operation is passed. When the program operation is not passed within a predetermined reference time, it may be determined that the program operation is failed. Alternatively, when the program operation is not passed until a program loop corresponding to a preset maximum loop count proceeds, it may be determined that the program operation is faded. The word "predetermined" and "preset" as used herein with respect to a parameter, such as a predetermined reference time, predetermined reference, and preset value, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm The memory device 100 may include a program voltage register 101.

In an embodiment, the program voltage register 101 may include information related to voltages used for the program operation. Here, the information related to the voltages used for the program operation may include information on a magnitude of a program start voltage or a magnitude of a step voltage indicating an amount by which the program voltage increases each time the program loop is repeated.

The memory controller 200 may control an overall operation of the storage device 1000.

When power is applied to the storage device 1000, the memory controller 200 may execute firmware. When the memory device 100 is a flash memory device, the firmware may include a host interface layer, a flash translation layer, and a flash interface layer.

The host interface layer may control an operation between the host 400 and the memory controller 200.

The flash translation layer may convert a logical address provided from the host 400 into a physical address. To this end, the memory controller 200 may store map data that is a correspondence relationship between the logical address and the physical address.

The flash interface layer may control communication between the memory device 100 and the memory controller 200.

The memory controller 200 may control the memory device 100 to perform the program operation, the read operation, and the erase operation, respectively, in response to a write request, a read request, and an erase request of the host 400.

During the program operation, the memory controller 200 may provide the program command, the physical addresses, and the write data to the memory device 100.

During the read operation, the memory controller 200 may provide the read command and the physical address to the memory device 100.

In the erase operation, the memory controller 200 may provide the erase command and the physical address to the memory device 100.

The memory controller 200 may generate the command, the addresses, and data autonomously regardless of a request provided from the host 400. The memory controller 200 may transmit the autonomously generated command, address, and data to the memory device 100.

For example, the memory controller 200 may generate a command, an addresses, and data for performing a background operation. In addition, the memory controller 200 may provide the command, the address, and the data to the memory device 100.

In an embodiment, the background operation may be at least one of wear leveling, read reclaim, or garbage collection.

The wear leveling may mean, for example, static wear leveling, dynamic wear leveling, and the like. The static wear leveling may mean an operation of storing the number of times memory blocks are erased and moving cold data in which an erase operation or a write operation hardly occurs to a memory block having the largest number of erase times. The dynamic wear leveling may mean an operation of storing the number of times memory blocks are erased and programming data in a memory block having the least number of erase times.

The read reclaim may mean an operation of moving data stored in a memory block to another memory block before an uncorrectable error occurs in data stored in a memory block.

The garbage collection may mean an operation of copying valid data included in a bad block among memory blocks to a free block and erasing invalid data included in the bad block. Here, copying the valid data included in the bad block to the free block may mean moving the valid data included in the bad block to the free block.

The memory controller 200 may provide a response to the request provided by the host 400 to the host 400, and may wait until a subsequent request to be provided by the host 400 is received after the response is provided.

The memory controller 200 may control two or more memory devices 100. In this case, the memory controller 200 may control the memory devices 100 according to an interleaving method to improve operation performance.

The interleaving method may be a method of controlling operations of two or more memory devices 100 to overlap.

The memory controller 200 may determine the attributes of each of the plurality of write data corresponding to a write request in response to the write request provided from the host 400. For example, an attribute of some of the write data among the plurality of write data may have the hot data, and an attribute of the remaining write data among the plurality of write data may be the cold data. However, the present disclosure is not limited thereto.

The memory controller 200 may set the program voltage used for the program operation of storing the write data in the memory block based on a lookup table (not shown). For example, the memory controller 200 may set the program voltage used for the program operation of storing write data having the same attribute of the write data among the plurality of write data in the same memory block based on the lookup table.

Here, the lookup table may include the attribute of the write data and program information on the program voltage according to positions of the plurality of word lines. The program voltage may include the program start voltage and the step voltage. The memory controller 200 may control the memory device 100 to perform the program operation according to a set program voltage.

To this end, the memory controller 200 may include a program information storage 201 and a program operation controller 202.

The program information storage 201 may store the lookup table. In an embodiment, the program information storage 201 may store a plurality of lookup tables generated for each word line group in which the plurality of word lines are divided according to a predetermined reference.

The program operation controller 202 may control the memory device 100 to set the program voltage from the program information corresponding to the attribute of the write data using the lookup table and apply the program voltage to the selected word line among the plurality of word lines.

According to that described above, the write data having the same attribute of the write data may be stored in the same memory block. That is, only the write data having the same attribute may be stored in one memory block.

Although not shown, the storage device 1000 may further include a buffer memory. For example, the buffer memory may be implemented with any one of a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), a resistive random access memory (RRAM), a magnetoresistive random access memory (MRAM), a ferroelectric random access memory, and a spin transfer torque random access memory (STT-RAM).

The host 400 may communicate with the storage device 1000 through an interface (not shown).

The interface may be implemented with a serial advanced technology attachment (SATA) interface, a SATA express (SATA express) interface, a serial attached small computer system interface (SAS) interface, a peripheral component interconnect express (PCIe) interface, a non-volatile memory express (NVMe) interface, an advanced host controller interface (AHCI), or a multimedia card interface. However, the interface is not limited thereto.

The host 400 may communicate with the storage device 1000 to store the write data in the storage device 1000 or obtain the read data stored in the storage device 1000.

In an embodiment, the host 400 may provide the write request to the storage device 1000 for requesting to store the write data in the storage device 1000, In addition, the host 400 may provide the write request, the write data, and a logical address for identifying the write data to the storage device 1000.

The storage device 1000 may store the write data provided by the host 400 in the memory device 100 in response to the write request provided from the host 400 and provide a response that the storage is completed to the host 400.

In an embodiment, the host 400 may provide the read request to the storage device 1000 for requesting to provide the data stored in the storage device 1000 to the host 400. In addition, the host 400 may provide a read request and a read address to the storage device 1000.

The storage device 1000 may read the read data corresponding to the read address provided by the host 400 from the memory device 100 in response to the read request provided from the host 400 and provide the read data to the host 400 as a response to the read request.

Figure 2:
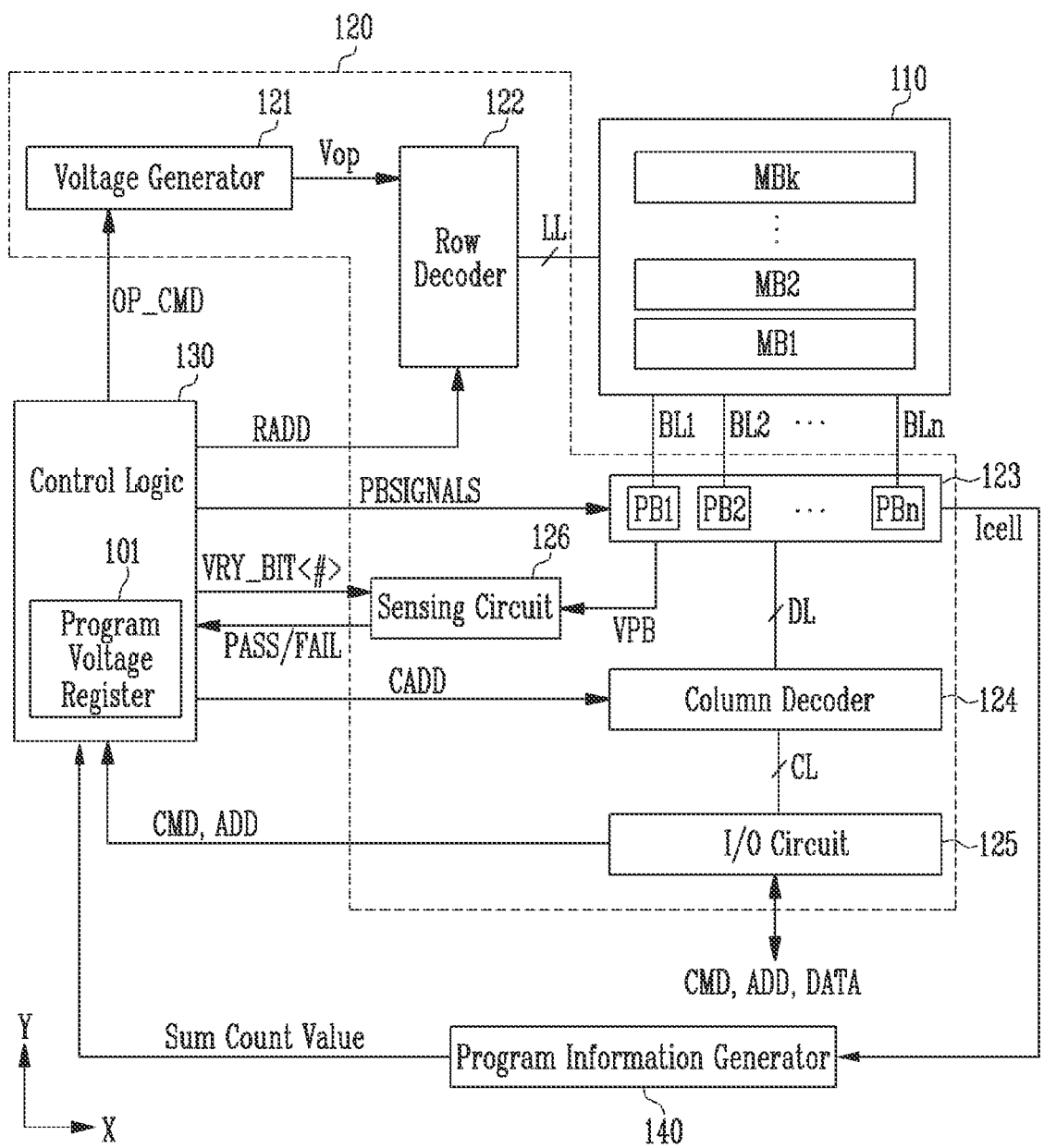
FIG. 2 is a diagram illustrating a memory device according to an embodiment of the present disclosure.

FIG. 2 is a diagram illustrating a memory device according to an embodiment of the present disclosure.

Referring to FIGS. 1 and 2, the memory device 100 may include a memory cell array 110, a peripheral circuit 120, control logic 130, and a program information generator 140, The control logic 130 may be implemented as hardware, software, or a combination of hardware and software. For example, the control logic 130 may be a control logic circuit operating in accordance with an algorithm and/or a processor executing control logic code.

The memory cell array 110 may include a plurality of memory blocks MB1 to MBk (k is a positive integer). Here, the number of the plurality of memory blocks MB1 to MBk is only an example for describing embodiments of the present disclosure, but is not limited thereto.

Each of the memory blocks MB1 to MBk may be connected to local lines LL and bit lines BL1 to BLn (n is a positive integer).

The local lines LL may be connected to a row decoder 122.

The local lines LL may be connected to each of the memory blocks MB1 to MBk.

Although not shown, the local lines LL may include a first select line, a second select line, and a plurality of word lines arranged between the first select line and the second select line.

Although not shown, the local lines LL may further include dummy lines arranged between the first select line and the plurality of word lines, dummy lines arranged between the second select line and the plurality of word lines, and pipelines.

The bit lines BL1 to BLn may be commonly connected to the memory blocks MB1 to MBk.

The memory blocks MB1 to MBk may be implemented as a two-dimensional or three-dimensional structure.

For example, in the memory blocks MB1 to MBk of the two-dimensional structure, memory cells may be arranged in a direction parallel to a substrate.

For example, in the memory blocks MB1 to MBk of the three-dimensional structure, memory cells may be stacked on a substrate in a vertical direction.

The peripheral circuit 120 may include a voltage generator 121, the row decoder 122, a page buffer group 123, a column decoder 124, an input/output circuit 125, and a sensing circuit 126.

The voltage generator 121 may generate various operation voltages Vop used for the program operation, the read operation, and the erase operation in response to an operation command OP_CMD. In addition, the voltage generator 121 may selectively discharge the local lines LL in response to the operation command OP_CMD. For example, the voltage generator 121 may generate a program voltage, a verify voltage, pass voltages, a turn-on voltage, a read voltage, an erase voltage, a source line voltage, and the like under control of the control logic 130.

As an embodiment, the voltage generator 121 may regulate an external power voltage to generate an internal power voltage. The internal power voltage generated by the voltage generator 121 is used as an operation voltage of the memory device 100.

As an embodiment, the voltage generator 121 may generate a plurality of voltages using an external power voltage or an internal power voltage. For example, the voltage generator 121 may include a plurality of pumping capacitors that receive the internal power voltage, and may generate the plurality of voltages by selectively activating the plurality of pumping capacitors in response to the control of the control logic 130, The plurality of generated voltages may be supplied to the memory cell array 110 by the row decoder 122.

The row decoder 122 may transfer the operation voltages Vop to the local lines LL in response to a row address RADD. The operation voltages Vop may be transferred to selected memory blocks MB1 to MBk through the local lines LL.

For example, during the program operation, the row decoder 122 may apply the program voltage to selected word lines and a program pass voltage of a level less than that of the program voltage to unselected word lines. During the program verify operation, the row decoder 122 may apply the verify voltage to the selected word line and a verify pass voltage of a level greater than that of the verify voltage to the unselected word lines.

During the read operation, the row decoder 122 may apply the read voltage to the selected word line, and apply a read pass voltage of a level greater than that of the read voltage to the unselected word lines.

During the erase operation, the row decoder 122 may select one memory block according to a decoded address. During the erase operation, the row decoder 122 may apply a ground voltage to word lines connected to the selected memory block.

The page buffer group 123 may include first to n-th page buffers PB1 to PBn. The first to n-th page buffers PB1 to PBn may be connected to the memory cell array 110 through the first to n-th bit lines BL1 to BLn, respectively. The first to n-th page buffers PB1 to PBn may operate in response to the control of the control logic 130.

For example, the first to n-th page buffers PB1 to PBn may operate in response to page buffer control signals PBSIGNALS. For example, the first to n-th page buffers PB1 to PBn may temporarily store data received through the first to n-th bit lines BL1 to BLn, or may sense a voltage or a current of the bit lines BL1 to BLn during the read operation or the verify operation.

In the program voltage apply operation, when the program voltage is applied to the selected word line, the first to n-th page buffers PB1 to PBn may transfer data DATA (for example, the write data) received through the column decoder 124 and the input/output circuit 125 to the selected memory cell through the first to n-th bit lines BL1 to BLn. The memory cells of the selected page are programmed according to the transferred data DATA. The memory cell connected to the bit line to which a program permission voltage (for example, a ground voltage) is applied may have an increased threshold voltage. The threshold voltage of the memory cell connected to the bit line to which a program inhibit voltage (for example, a power voltage) is applied may be maintained.

In the verify operation, the first to n-th page buffers PB1 to PBn may sense data stored in the memory cells selected through the first to n-th bit lines BL1 to BLn from the selected memory cells. The stored data of the selected memory cells may be provided to the first to n-th page buffers PB1 to PBn in a sensing current form of the selected memory cells.

In the verify operation, the first to n-th page buffers PB1 to PBn may sense whether a threshold voltage of each of the plurality of memory cells exceeds the verify voltage through the first to n-th bit lines BL1 to BLn.

During the read operation, the first to n-th page buffers PB1 to PBn may sense the data DATA from the memory cells of the selected page through the first to n-th bit lines BL1 to BLn, and output the read data DATA to the input/output circuit 125 under the control of the column decoder 124.

During the erase operation, the first to n-th page buffers PB1 to PBn may float the first to n-th bit lines BL1 to BLn.

The column decoder 124 may transfer data between the input/output circuit 125 and the page buffer group 123 in response to a column address CADD. For example, the column decoder 124 may exchange data with the page buffers PB1 to PBn through data lines DL, or may exchange data with the input/output circuit 125 through column lines CL.

The input/output circuit 125 may transfer the command CMD and the address ADD received from the memory controller 200 to the control logic 130, or may exchange data DATA with the column decoder 124.

During the read operation or the verify operation, the sensing circuit 126 may generate a reference current in response to a permission bit signal VRY_BIT<#> and compare a sensing voltage VPB received from the page buffer group 123 with a reference voltage generated by the reference current to output a pass signal PASS or a fail signal FAIL. Here, the pass signal PASS may be a signal indicating that verification for any one of the plurality of program states is passed. The fail signal FAIL may be a signal indicating that the verification for any one of the plurality of program states is failed.

In an embodiment, in the verify operation, the sensing circuit 126 may determine whether the verification for each of the plurality of program states is passed based on a sensing current corresponding to the sensing voltage VPB received from the page buffer group 123 and a reference current, and may output the pass signal PASS or the fail signal FAIL according to a determination result.

For example, in the verify operation, when the sensing current is less than the reference current, it may be determined that the selected memory cells are programmed to a specific program state corresponding to the target state. Therefore, the sensing circuit 126 may determine that the verification for the specific program state is passed, and may output the pass signal PASS corresponding thereto. In the verify operation, when the sensing current is equal to or greater than the reference current, the sensing circuit 126 may determine that the verification for the specific program state is failed, and may output the fail signal FAIL corresponding thereto.

The control logic 130 may output the operation command OP_CMD, the row address RADD, the page buffer control signals PBSIGNALS, and the permission bit VRY_BIT<#> in response to the command CMD and the address ADD to control the peripheral circuit 120.

The control logic 130 may include the program voltage register 101 shown in FIG. 1. A detailed description thereof is described later with reference to FIGS. 9 to 11.

The program information generator 140 may receive an on-cell current Icell from the page buffer group 123, Here, the on-cell current Icell may be a current generated from the on-cell, that is, a memory cell having a threshold voltage equal to or less than the verify voltage among the selected memory cells. Alternatively, the on-cell current Icell may mean a current flowing through the bit lines BL1 to BLn during the verify operation.

The program information generator 140 may generate a sum count value based on the on-cell current Icell. Here, the sum count value may be a sum of count values (not shown). The count value may mean a digital value corresponding to a difference between the on-cell current Icell and a preset reference on-cell current (not shown).

The program information generator 140 may provide the generated sum count value to the control logic 130.

A detailed description of the program information generator 140 is described later with reference to FIG. 10.

Figure 3:
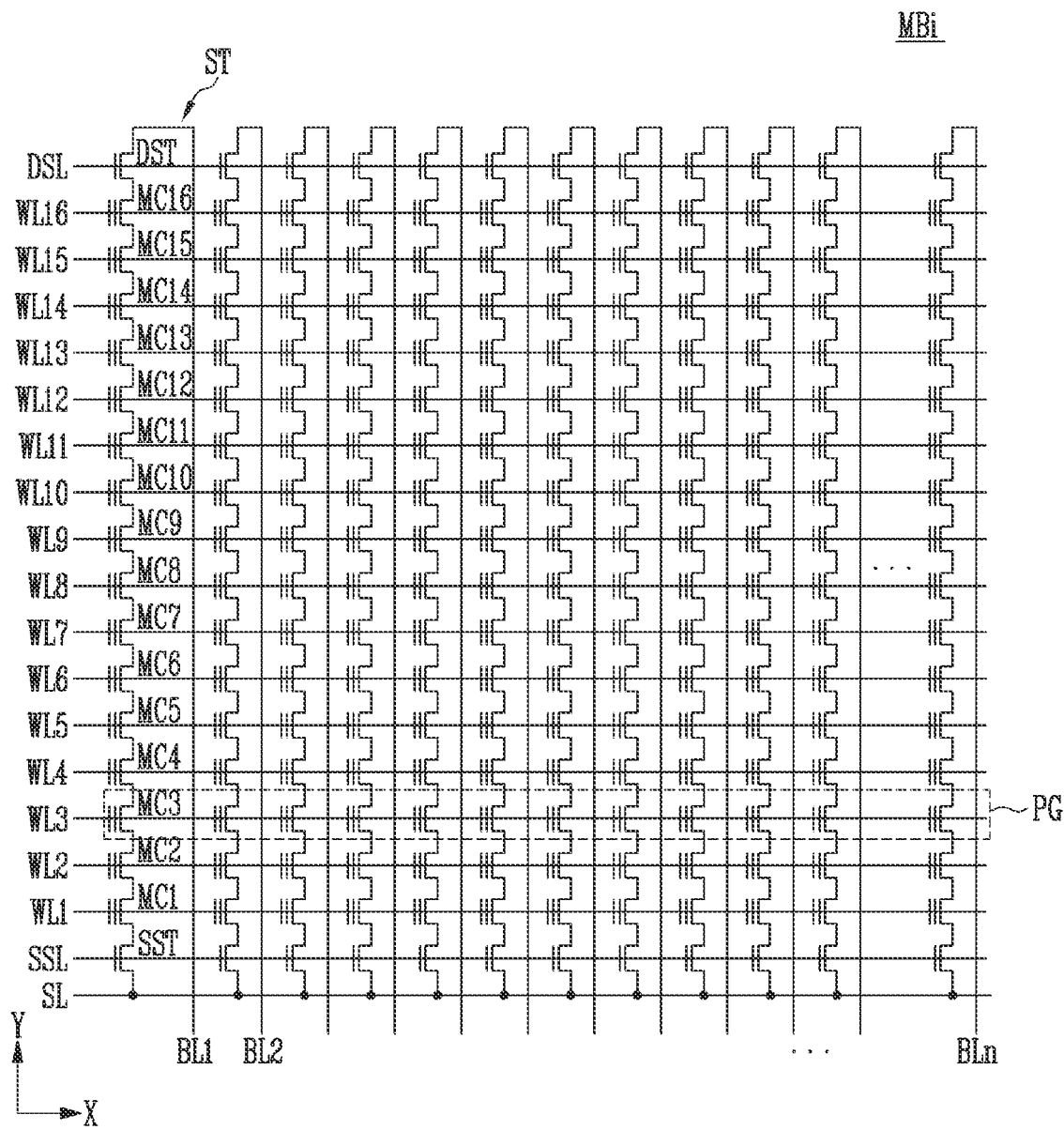
FIG. 3 is a diagram illustrating a structure of any one of a plurality of memory blocks shown in FIG. 2.

FIG. 3 is a diagram illustrating a structure of any one of the plurality of memory blocks shown in FIG. 2.

Referring to FIG. 3, the memory block MBi shown in FIG. 3 may be any one of the memory blocks MB1 to MBk of FIG. 2.

The memory block MBi may include a first select line, a second select line, a plurality of word lines WL1 to WL16, a source line SL, a plurality of bit lines BL1 to BLn, and a plurality of strings ST.

The first select line may be, for example, a source select line SSL. Hereinafter, it is assumed that the first select line is the source select line SSL.

The second select line may be, for example, a drain select line DSL. Hereinafter, it is assumed that the second select line is the drain select line DSL.

The plurality of word lines WL1 to WL16 may be arranged in parallel between the source select line SSL and the drain select line DSL.

The number of word lines WL1 to WL16 shown in FIG. 3 is an example, and is not limited to that shown in the drawing.

The source line SL may be commonly connected to the plurality of strings ST.

The plurality of bit lines BL1 to BLn may be connected to the strings ST, respectively.

The plurality of strings ST may be connected to the bit lines BL1 to BLn and the source line SL.

Since the strings ST may be configured to be identical to each other, the string ST connected to the first bit line BL1 is described as an example.

The string ST may include a plurality of memory cells MC1 to MC16, at least one first select transistor, and at least one second select transistor.

The plurality of memory cells MC1 to MC16 may be connected in series between a first select transistor and a second select transistor.

Gates of the memory cells MC1 to MC16 may be connected to the plurality of word lines WL1 to WL16, respectively. Therefore, the number of memory cells MC1 to MC16 included in one string ST may be the same as the number of word lines WL1 to WL16.

Any one of the plurality of memory cells MC1 to MC16 may be configured of any one of the SLC, the MLC, the TLC, and the QLC.

A group of memory cells connected to the same word line among memory cells included in different strings ST may be referred to as a physical page PG. Therefore, the memory block MBi may include the physical pages PG corresponding to the number of word lines WL1 to WL16. Hereinafter, it is assumed that memory cells (for example, MC3) included in the physical page PG are selected memory cells.

The first select transistor may be, for example, a source select transistor SST. Hereinafter, it is assumed that the first select transistor is the source select transistor SST.

A first electrode of the source select transistor SST may be connected to the source line SL. A second electrode of the source select transistor SST may be connected to the first memory cell MC1 among the plurality of memory cells MC1 to MC16. A gate electrode of the source select transistor SST may be connected to the source select line SSL.

The second select transistor may be, for example, a drain select transistor DST. Hereinafter, it is assumed that the second select transistor is the drain select transistor DST.

A first electrode of the drain select transistor DST may be connected to the sixteenth memory cell MC16 among the plurality of memory cells MC1 to MC16. A second electrode of the drain select transistor DST may be connected to the first bit line BL1. A gate electrode of the drain select transistor DST may be connected to the drain select line DSL.

Figure 4:
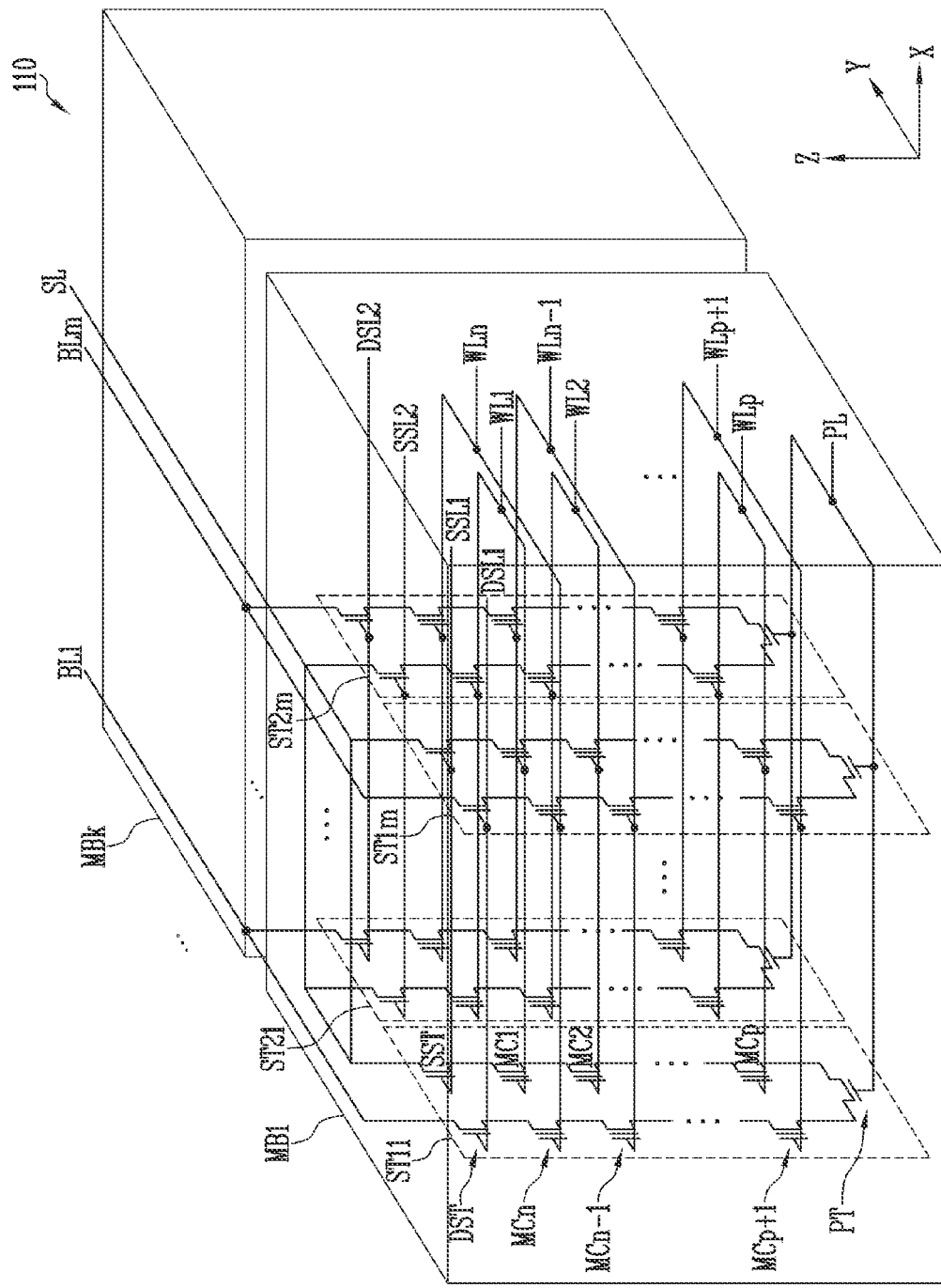
FIG. 4 is a diagram illustrating an embodiment of a memory block of a three-dimensional structure.

FIG. 4 is a diagram illustrating an embodiment of a memory block of a three-dimensional structure.

Referring to FIG. 4, the memory cell array 110 may include a plurality of memory blocks MB1 to MBk. Each of the memory blocks MB1 to MBk may include a plurality of strings ST11 to ST1*m* and ST21 to ST2*m*. As an embodiment, each of the plurality of strings ST11 to ST1*m* and ST21 to ST2*m* may be formed in a 'U' shape. In the first memory block MB1, m strings may be arranged in a row direction (for example, an X direction). Here, m may be a positive integer greater than 1. In FIG. 4, two strings are arranged in a column direction (for example, a Y direction), but this is for convenience of description, and three or more strings may be arranged in the column direction.

Each of the plurality of strings ST11 to ST1m and ST21 to ST2m may include at least one source select transistor SST first to n-th memory cells MC1 to MCn, a pipe transistor PT, and at least one drain select transistor DST.

The source and drain select transistors SST and DST and the memory cells MC1 to MCn may have similar structures. For example, each of the source and drain select transistors SST and DST and the memory cells MC1 to MCn may include a channel film, a tunnel insulating film, a charge trap film, and a blocking insulating film. For example, a pillar for providing the channel film may be provided in each string. For example, a pillar for providing at least one of the channel film, the tunnel insulating film, the charge trap film, and the blocking insulating film may be provided in each string.

The source select transistor SST of each string may be connected between the source line SL and the memory cells MC1 to MCp.

As an embodiment, the source select transistors of the strings arranged in the same row may be connected to the source select line extending in the row direction (for example, the X direction), and the source select transistors of the strings arranged in different rows may be connected to different source select lines. In FIG. 4, the source select transistors of the strings ST11 to ST1m of a first row may be connected to a first source select line SSL1. The source select transistors of the strings ST21 to ST2m of a second row may be connected to a second source select line SSL2.

As another embodiment, the source select transistors of the strings ST11 to ST1m and ST21 to ST2m may be commonly connected to one source select line.

The first to n-th memory cells MC1 to MCn of each string may be connected between the source select transistor SST and the drain select transistor DST.

The first to n-th memory cells MC1 to MCn may be divided into first to p-th (p is a positive integer greater than 1 and less than n) memory cells MC1 to MCp and (p+1)-th to n-th memory cells MCp+1 to MCn. The first to p-th memory cells MC1 to MCp may be sequentially arranged in a vertical direction (for example, a Z direction), and may be connected in series between the source select transistor SST and the pipe transistor PT. The (p+1)-th to n-th memory cells MCp+1 to MCn may be sequentially arranged in the vertical direction, and may be connected in series between the pipe transistor PT and the drain select transistor DST, The first to p-th memory cells MC1 to MCp and the (p+1)-th to n-th memory cells MCp+1 to MCn may be connected to each other through the pipe transistor PT. Gates of the first to n-th memory cells MC1 to MCn of each string may be connected to the first to the n-th word lines WL1 to WLn, respectively.

The first to n-th word lines WL1 to WLn connected to the first to n-th memory cells MC1 to MCn may also be stacked in the vertical direction.

At least one word line disposed at a lowest position among the word lines WL1 to WLn may be referred to as a bottom word line. For example, since the p-th word line WLp or the (p+1)-th word line WLp+1 among the word lines WL1 to WLn is positioned at the lowermost position of the first memory block MB1, the bottom word line may be the p-th word line WLp or the (p+1)-th word line WLp+1.

At least one word line disposed at an uppermost position among the word lines WL1 to WLn may be referred to as a top word line. For example, since the first word line WL1 or the n-th word line WLn among the word lines WL1 to WLn is positioned at the uppermost position of the first memory block MB1, the top word line may be the first word line WL1 or the n-th word line WLn.

At least one word line disposed between the bottom word line and the top word line among the word lines WL1 to WLn may be referred to as a middle word line. Although not shown, for example, among the word lines WL1 to WLn, a word line existing between the p-th word line WLp and the first word line WL1 may be the middle word line.

The word lines WL1 to WLn may be divided into a plurality of word line groups. The word line group may be a group divided according to a position of the word line.

In an embodiment, the word lines WL1 to WL n may be divided into first to third word line groups. The first word line group may include word lines positioned at a relatively lower portion of the word lines WL1 to WLn. The second word line group may include word lines positioned at a relatively middle of the word lines WL1 to WLn. The third word line group may include word lines positioned at a relatively upper portion of the word lines WL1 to WLn. For example, the first word line group may include the bottom word line, the second word line group may include the middle word line, and the third word line group may include the top word line.

A characteristics of the memory cell may vary according to positions of the memory cells MC1 to MCn. Here, the characteristic of the memory cell may mean, for example, a thickness of a tunnel insulating layer and a program operation speed according to the thickness of the tunnel insulating layer. For example, among the memory cells MC1 to MCn, the thickness of the tunnel insulating layer of the memory cells MC1 and MCp connected to the top word line among the memory cells MC1 to MCn may be thicker than the thickness of the tunnel insulating layer of the memory cells MCp and MCp+1 connected to the bottom word line among the memory cells MC1 to MCn. That is, the thickness of the tunnel insulating layer of the memory cell may become thinner from the top word line to the bottom word line. For example, the program operation speed of the memory cell may gradually increase from the top word line to the bottom word line.

As an embodiment, at least one of the first to n-th memory cells MC1 to MCn may be used as a dummy memory cell. When the dummy memory cell is provided, a voltage or a current of a corresponding string may be stably controlled. A gate of the pipe transistor PT of each string may be connected to the pipeline PL.

The drain select transistor DST of each string may be connected between the bit line and the memory cells MCp+1 to MCn. The strings arranged in the row direction may be connected to the drain select line extending in the row direction. The drain select transistors of the strings ST11 to ST1m of the first row may be connected to a first drain select line DSL1. The drain select transistors of the strings ST21 to ST2m of the second row may be connected to a second drain select line DSL2.

The strings arranged in the column direction may be connected to the bit lines extending in the column direction. In FIG. 4, the strings ST11 and ST21 of a first column may be connected to the first bit line BL1, The strings ST1m and ST2m of an m-th column may be connected to the m-th bit line BLm.

Among the strings arranged in the row direction, the memory cells connected to the same word line may configure one page. For example, the memory cells connected to the first word line WL1 among the strings ST11 to ST1m of the first row may configure one page. The memory cells connected to the first word line WL1 among the strings ST21 to ST2m of the second row may configure another page. The strings arranged in one row direction will be selected by selecting any one of the drain select lines DSL1 and DSL2. One page of the selected strings will be selected by selecting any one of the word lines WL1 to WLn.

Figure 5:
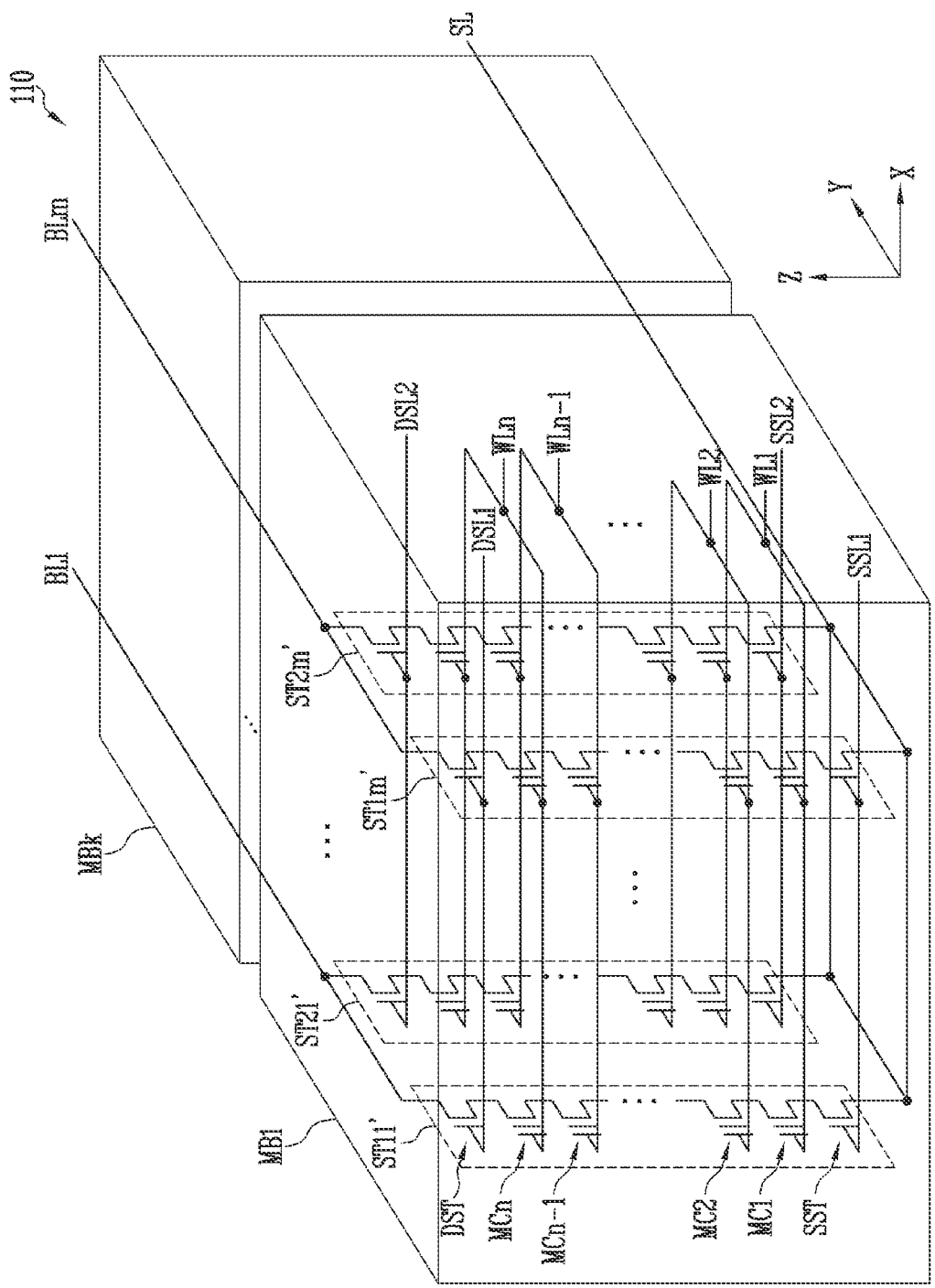
FIG. 5 is a diagram illustrating another embodiment of the memory block of the three-dimensional structure.

FIG. 5 is a diagram illustrating another embodiment of the memory block of the three-dimensional structure.

Referring to FIG. 5, the memory cell array 110 may include a plurality of memory blocks MB1 to MBk. Each of the memory blocks MB1 to MBk may include a plurality of strings ST11' to ST1' and ST21" to ST2m'. Each of the plurality of strings ST11' to ST1m and ST21' to ST2m' may be extended along the vertical direction (for example, the Z direction). In the blocks MB1 to MBk, m strings may be arranged in the row direction (for example, the X direction). In FIG. 5, two strings are arranged in the column direction (for example, the Y direction), but this is for convenience of description, and three or more strings may be arranged in the column direction.

Each of the plurality of strings ST11' to ST1m' and ST21' to ST2m' may include at least one source select transistor SST, first to n-th memory cells MC1 to MCn, and at least one drain select transistor DST.

The source select transistor SST of each string may be connected between the source line SL and the memory cells MC1 to MCn. The source select transistors of the strings arranged in the same row may be connected to the same source select line. The source select transistors of the strings ST11' to ST1m' arranged in the first row may be connected to a first source select line SSL1. The source select transistors of the strings ST21' to ST2m' arranged in the second row may be connected to a second source select line SSL2. As another embodiment, the source select transistors of the strings ST11' to ST1m' and ST21' to ST2m' may be commonly connected to one source select line.

The first to n-th memory cells MC1 to MCn of each string may be connected to each other in series between the source select transistor SST and the drain select transistor DST. Gates of the first to n-th memory cells MC1 to MCn may be connected to the first to n-th word lines WL1 to WLn, respectively.

As described above with reference to FIG. 4, the first to n-th word lines WL1 to WLn connected to the first to n-th memory cells MC1 to MCn may also be stacked in the vertical direction. In an embodiment, among the word lines WL1 to WLn, the bottom word line (i.e., lowermost position among the plurality of word lines WL1 to WLn) may be the first word line WL1, the top word line (i.e., uppermost position among the plurality of word lines WL1 to WLn) may be the n-th word line WLn, and the middle word line may be the word line positioned between the first word line WL1 and the n-th word line WLn. In an embodiment, the first to n-th memory cells MC1 to MCn may be respectively connected to a plurality of word lines WL1 to WLn and the plurality of word lines WL1 to WLn may be vertically stacked, for example, in the Z-direction as indicated in FIG. 5. In an embodiment, the first to p-th memory cells MC1 to MCp may be respectively connected to a plurality of word lines WL1 to WLp and the plurality of word lines WL1 to WLp may be vertically stacked, for example, in the Z-direction as indicated in FIG. 4. In an embodiment, the n-th to p+1-th memory cells MCn to MCp+1 may be respectively connected to a plurality of word lines WLn to WLp+1 and the plurality of word lines WLn to WLp+1 may be vertically stacked, for example, in the Z-direction as indicated in FIG. 4.

The word lines WL1 to WLn may be divided into a plurality of word line groups. In an embodiment, the word lines WL1 to WLn may be divided into a first word line group including the bottom word line, a second word line group including the middle word line, and the third word line group including the top word line.

As described above with reference to FIG. 4, the characteristic of the memory cell (for example, the thickness of the tunnel insulating layer and the program operation speed according to the thickness of the tunnel insulating layer) may vary according to the positions of the memory cells MC1 to MCn. Here, for example, the thickness of the memory cell may become thinner from the top word line to the bottom word line. For example, the program operation speed of the memory cell may gradually increase from the top word line to the bottom word line.

As an embodiment, at least one of the first to n-th memory cells MC1 to MCn may be used as a dummy memory cell. When the dummy memory cell is provided, a voltage or a current of a corresponding string may be stably controlled. Therefore, reliability of the data stored in the memory blocks MB1 to MBk may be improved.

The drain select transistor DST of each string may be connected between the bit line and the memory cells MC1 to MCn. The drain select transistors DST of the strings arranged in the row direction may be connected to the drain select line extending in the row direction. The drain select transistors DST of the strings ST11' to ST1m' of the first row may be connected to a first drain select line DSL1. The drain select transistors DST of the strings ST21' to ST2m' of the second row may be connected to a second drain select line DSL2.

That is, the memory blocks MB1 to MBk of FIG. 5 may have an equivalent circuit similar to that of the memory blocks MB1 to MBk of FIG. 4 except that the pipe transistor PT is excluded from each string.

Figure 6:
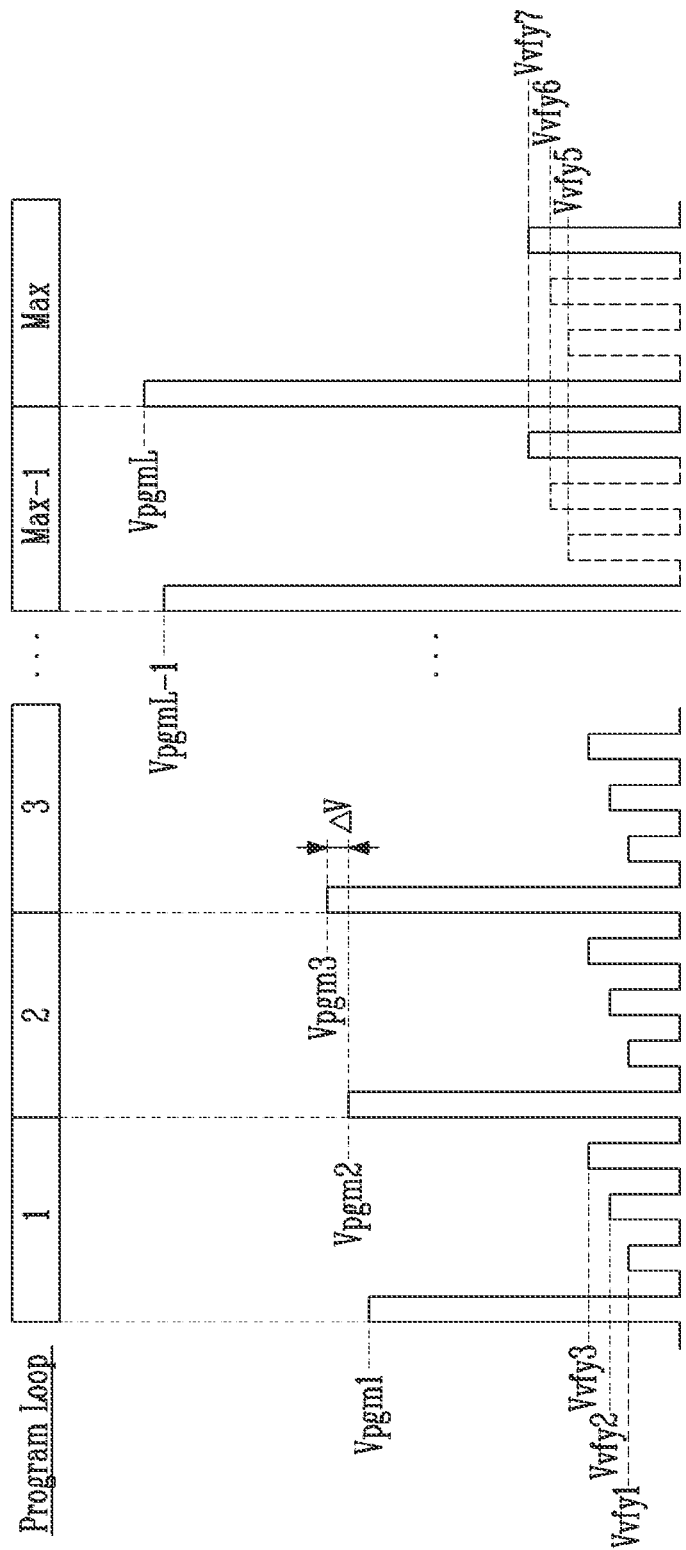
FIG. 6 is a diagram conceptually illustrating a program operation according to an embodiment of the present disclosure.

FIG. 6 is a diagram conceptually illustrating the program operation according to an embodiment of the present disclosure.

In describing the embodiment shown in FIG. 6, it is assumed that the selected memory cells are TLCs that store three bits of data.

Referring to FIG. 6, the program operation may include a plurality of program loops. A value of each program loop may be a loop count. For example, a value of a first program loop may be 1, a value of a second program loop may be 2, and a value of a third program loop may be 3.

One program loop may include a program voltage apply operation and a verify operation.

For example, the first program loop may include a first program voltage apply operation of applying a first program voltage Vpgm1 and a first verify operation of sequentially applying first to third verify voltages Vvfy1 to Vvfy3. For example the second program loop may include a second program voltage apply operation of applying a second program voltage Vpgm2 and a second verify operation of sequentially applying the first to third verify voltages Vvfy1 to Vvfy3. For example, a (Max-1)-th program loop may include an (L-1)-th program voltage apply operation of applying an (L-1)-th program voltage VpgmL-1 and an (L-1)-th verify operation of sequentially applying fifth to seventh verify voltages Vvfy5 to Vvfy7. Here, L may be a natural number.

The program voltage Vpgm may be provided according to an incremental step pulse program (ISPP) method. The program voltage Vpgm may increase by a predetermined step voltage $\Delta V$ each time the program loop is repeated. That is, the program voltage Vpgm may sequentially increase from the first program voltage Vpgm1 to an L-th program voltage VpgmL.

In an embodiment, the program voltage Vpgm may be configured of a program start voltage and the step voltage ΔV.

The program start voltage may be a program voltage applied to the selected word line among the plurality of word lines in an initial program loop among the plurality of program loops included in the program operation. For example, the program start voltage may be the first program voltage Vpgm1 applied to the selected word line in the first program loop.

The step voltage ΔV may correspond to an increase amount of the program voltage as the program loop is repeated.

The number of verify voltages may be determined according to the number of the plurality of program states, Referring to FIG. 6, for example, when the memory cell is the TLC, since the number of program states is seven, the number of verify voltages Vvfy1 to Vvfy7 may be seven. However, the present disclosure is not limited thereto.

The program voltages Vpgm1 to VpgmL and the verify voltages Vvfy1 to Vvfy7 may be repeated until a maximum program loop Max proceeds.

A program state to be verified, that is, verify voltages to be applied in the verify operation included in a specific program loop may be determined in advance by an experiment, design, and the like in consideration of the number of erasures and programs before the storage device 1000 is shipped. Here, as the number of erasures and programs increases, a speed at which the selected memory cells are programmed may increase. Therefore, in consideration of a characteristics of the memory cells according to the increase of the number of erasures and programs, the verify voltage to be applied in the specific program loop may be set.

Referring to FIG. 6, for example, verification for the first to third program states may be performed for each program loop, from the first program loop to the third program loop. That is, the first to third verify voltages Vvfy1 to Vvfy3 may be applied to the selected word line for each program loop from the first program loop to the third program loop.

Figures 7, 8:
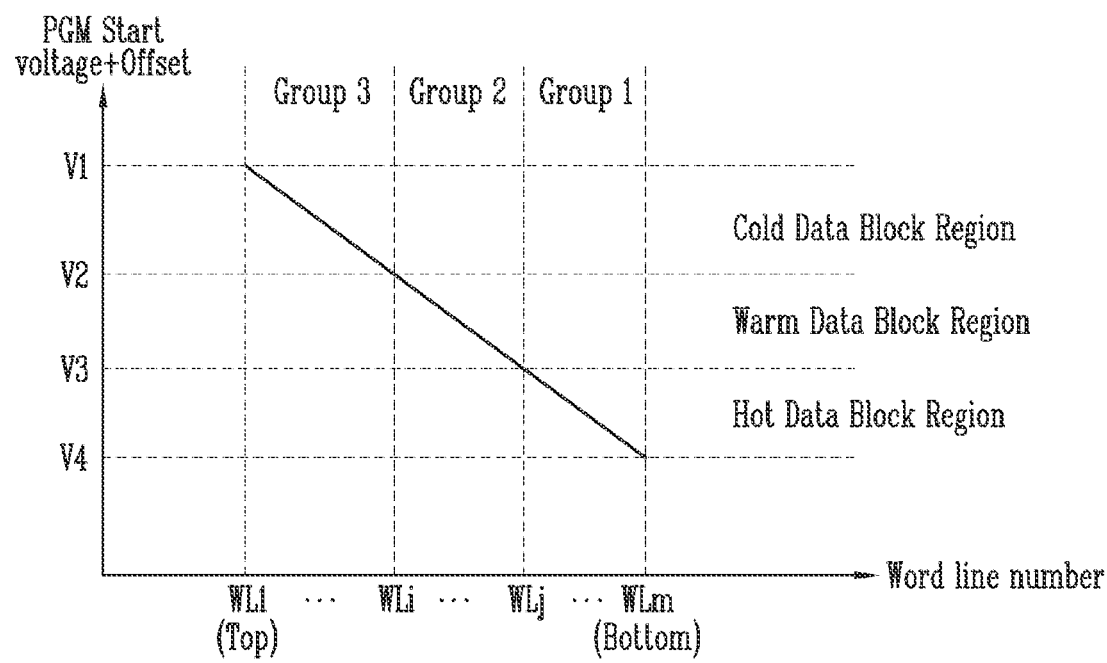
FIG. 7 is a diagram illustrating a structure of write data according to an embodiment of the present disclosure.
FIG. 8 is a diagram illustrating a change of a program voltage according to a position of a word line.

FIG. 7 is a diagram illustrating a structure of the write data according to an embodiment of the present disclosure.

Referring to FIG. 7, the write data may include seed data Seed Data and user data User Data.

In an embodiment, the seed data Seed Data may include page information PAGE, attribute information of the write data, and write erase cycling information EW Cycle. Here, for example, the attribute information of the write data may indicate any one of hot data HOT, cold data COLD, and warm data WARM.

In an embodiment, the user data User Data may include data DATA indicating a content that a user wants to store, cyclic redundancy check information CRC, and parity, Here, the parity may be, for example, an low-density-parity-check (LDPC) parity.

In an embodiment, the memory controller 200 may determine the attribute of the write data as any one of the hot data HOT, the warm data WARM, and the cold data COLD, by using the seed data Seed Data included in the write data.

FIG. 8 is a diagram illustrating a change of the program voltage according to the position of the word line.

As described above with reference to FIGS. 4 and 5, the characteristic of the memory cells may vary according to the positions of the memory cells MC1 to MCn. For example, the thickness of the tunnel insulating layer of the memory cell decreases from the top word line to the bottom word line, and thus the program operation speed of the memory cell may gradually increase. Therefore, in order to increase reliability of an overall program operation by uniformly adjusting the program operation speed that is different for each word line, the program voltage may be applied differently for each word line.

Referring to FIG. 8, a level of the program voltage may gradually decrease from the top word line to the bottom word line. Here, the program voltage may include a program start voltage PGM Start Voltage and an offset Offset. The offset Offset may be a preset value in consideration of an error that may occur during the program operation. For example, assuming that the top word line is a first word line WL1, the middle word line is an i-th word line WLi (i is a natural number greater than 1 and less than j) and a j-th word line WLj (j is a natural number greater than i and less than m), and the bottom word line is an m-th word line WLm (m is a natural number greater than j), the level of the program voltage applied to the first word line WL1 may be V1, the level of the program voltage applied to the i-th word line WLi may be V2 less than V1, the level of the program voltage applied to the j-th word line WLj may be V3 less than V2, and the level of the program voltage applied to the m-th word line WLm may be V4 less than V3. That is, a sum of the program start voltage PGM Start Voltage and the offset Offset sum may gradually decrease from the first word line WL1 to the i-th word line WLi, the j-th word line WLj, and the m-th word line WLm.

In an embodiment, the program voltages may be divided into a hot data block region Hot Data Block Region, a warm data block region Warm Data Block Region, and a cold data block region Cold Data Block Region. For example, the program voltages included in a range from the level V4 of the program voltage to the level V3 of the program voltage may be defined as the hot data block region Hot Data Block Region. The program voltages included in a range from the level V3 of the program voltage to the level V2 of the program voltage may be defined as the warm data block region Warm Data Block Region. The program voltages included in a range from the level V2 of the program voltage to the level V1 of the program voltage nay be defined as the cold data block region Cold Data Block Region.

In an embodiment, the plurality of word line groups may be first to third word line groups Group 1 to Group 3. The first word line group Group 1 may be a group including the j-th word line WLj to the m-th word line WLm. The second word line group Group 2 may be a group including a word line (for example, an (i+1)-th word line (not shown)) next to the i-th word line WL1 to a word line (for example, a (j−1)-th word line (not shown)) previous to the j-th word line WLj. The third word line group Group 3 may be a group including the first word line WL1 to a word line (for example, an (i−1)-th word line (not shown)) previous to the i-th word line WU.

Meanwhile, since the number of accesses of the hot data is relatively greater than the number of accesses of the cold data and the number of accesses of the warm data, the write data, which is the hot data, may be stored in the memory cells connected to the bottom word line. The write data, which is the cold data, may be stored in the memory cells connected to the top word line. The write data, which is the warm data, may be stored in the memory cells connected to the middle word line. However, when all of the write data which is the hot data, the write data which is the warm data, and the write data which is the cold data are stored in one memory block, a read operation speed may be reduced.

In order to prevent the reduction of the read operation speed, the memory controller 200 may obtain the program information determined according to the attribute of the write data and the position of the selected word line using the lookup table, set the program voltage from the obtained program information, and perform the program operation according to the set program voltage. In this case, the write data having the same attribute of the write data may be stored in the same memory block, and thus the number of times a background operation such as garbage collection is performed may be reduced. When the number of times the background operation is performed is reduced, performance of the storage device 1000 may be prevented from being reduced.

Figure 9:
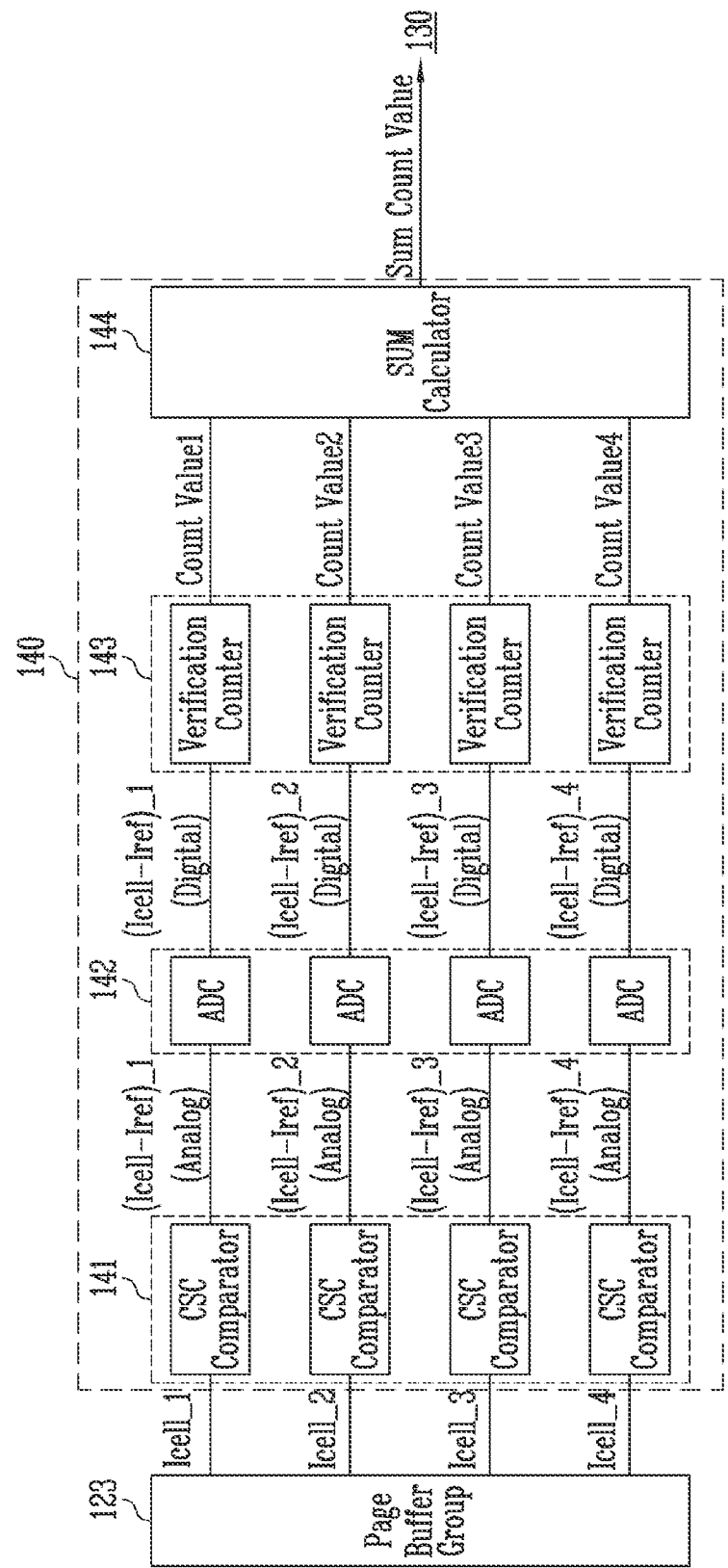
FIG. 9 is a diagram illustrating a program information generator according to an embodiment of the present disclosure.
Figure 10:
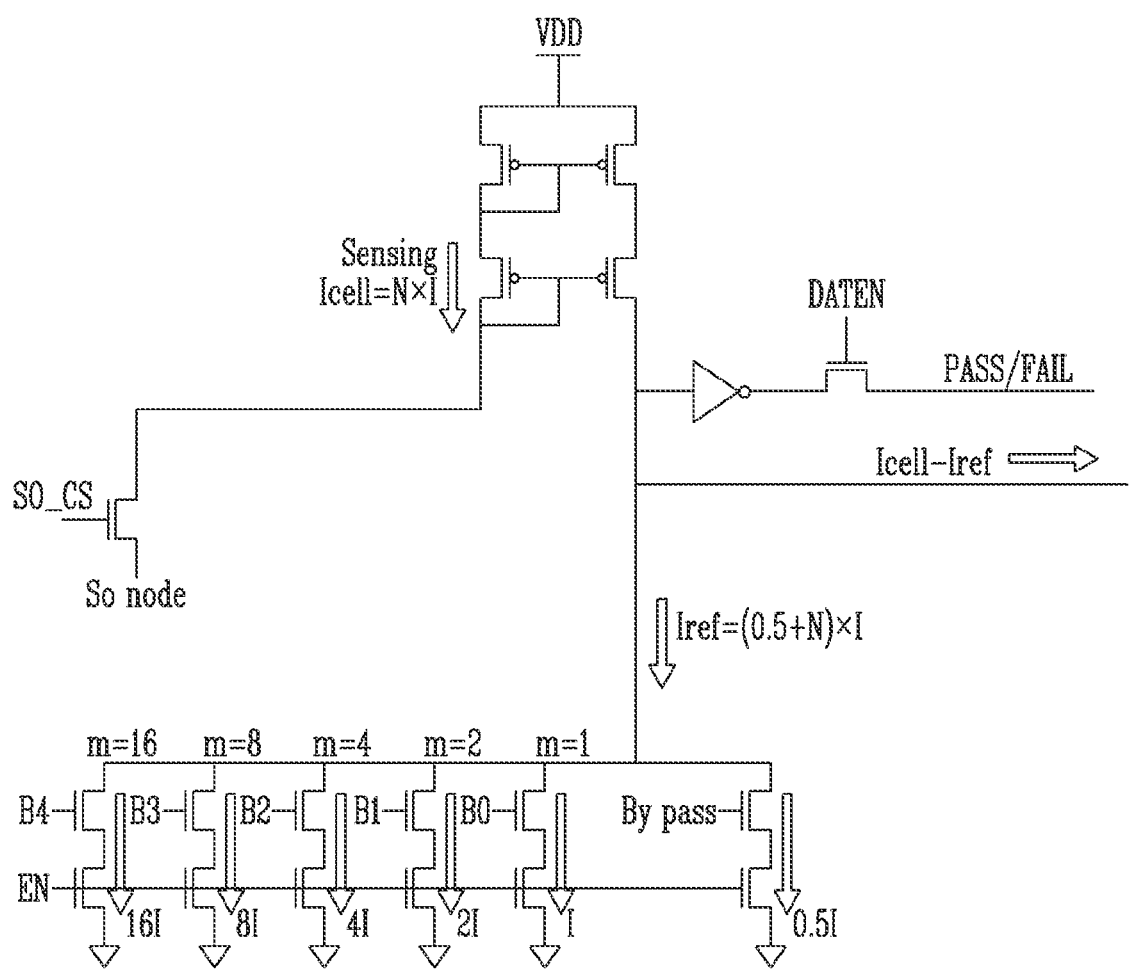
FIG. 10 is a diagram illustrating an embodiment of a CSC (Current Sensing Circuit) comparator shown in FIG. 9.

Meanwhile, the lookup table may be generated in advance from operations of each of the program information generator 140 and the control logic 130 included in the memory device 100, and may be stored in the program voltage register 101 included in the control logic 130, FIG. 9 is a diagram illustrating the program information generator according to an embodiment of the present disclosure, FIG. 10 is a diagram illustrating an embodiment of a CSC comparator shown in FIG. 9, and FIG. 11 is a diagram illustrating a plurality of lookup tables generated for each of the plurality of word line groups.

Referring to FIG. 9, the program information generator 140 may provide a sum count value to the control logic 130 based on on-cell currents Icell_1, Icell_2, Icell_3, and Icell_4 provided from the page buffer group 123.

To this end, the program information generator 140 may include a CSC comparator group 141, an analog-digital circuit group 142, a verification counter group 143, and a sum calculator 144.

The CSC comparator group 141 may output analog values (Icell-Iref)_1(Ana log), (Icell-Iref)_2(Ana log), (Icell-Iref)_3(Analog), and (Icell-Iref)_4(Analog) corresponding to the differences between each of the on-cell currents Icell_1, Icell_2, Icell_3, and Icell_4 and a reference on-cell current Iref.

In an embodiment, the CSC comparator group 141 may include a plurality of CSC comparators. The number of plurality of CSC comparators may be determined according to a size of the page buffer group 123 and a page unit. For example, when the page buffer group 123 performing the write operation is a page buffer group connected to one plane, the size of the page buffer group 123 is 16 KB, and the page unit is 4 KB, the number of plurality of CSC comparators may be four. However, the present disclosure is not limited thereto.

In an embodiment, one CSC comparator may be implemented with a circuit diagram as shown in FIG. 10, However, the present disclosure is not limited thereto.

The analog-digital circuit group 142 may convert the analog values (Icell-Iref)_1(Analog), (Icell-Iref)_2(Analog), (Icell-Iref)_3(Analog), and (Icell-Iref)_4(Analog) into digital values (Icell-Iref)_1(Digital), (Icell-Iref)_2(Digital), (Icell-Iref)_3(Digital), and (Icell-Iref)_4(Digital).

In an embodiment, the analog-digital circuit group 142 may include a plurality of analog-digital circuits. The number of plurality of analog-digital circuits may correspond to the number of plurality of CSC comparators. For example, when the number of plurality of CSC comparators is four, the number of plurality of analog-digital circuits may also be four. However, the present disclosure is not limited thereto.

The verification counter group 143 may output count values Count Value 1, Count Value 2, Count Value 3, and Count Value 4 corresponding to the digital values (Icell-Iref)_1(Digital), (Icell-Iref)_2(Digital), (Icell-Iref)_3(Digital), and (Icell-Iref)_4(Digital). In an embodiment, each of the count values Count Value 1, Count Value 2, Count Value 3, and Count Value 4 may be a code value.

The sum calculator 144 may output the sum count value that is a sum of the count values Count Value 1, Count Value 2, Count Value 3, and Count Value 4, A size of the sum count value may vary according to the attribute of the write data or the position of the word line.

In an embodiment, the control logic 130 may receive the sum count value and obtain program information corresponding to the sum count value from the lookup table.

In an embodiment, when the plurality of word lines are divided into a plurality of word line groups, the lookup table may be generated for each of the plurality of word line groups.

Referring to FIG. 11, for example, the plurality of lookup tables may include a first lookup table LUTE, a second lookup table LUT2, and a third lookup table LUT3.

The first lookup table LUT1 may be a lookup table corresponding to the first word line group including the bottom word line. Referring to FIG. 8, for example, the first lookup table LUT1 may be a lookup table corresponding to the first word line group Group 1 including the j-th word line WLj to the m-th word line WLm.

The second lookup table LUT2 may be a lookup table corresponding to the second word line group including the middle word line. Referring to FIG. 8, for example, the second lookup table LUT2 may be a lookup table corresponding to the second word line group Group 2 including the word lines between the i-th word line WL1 and the j-th word line WLj.

The third lookup table LUT3 may be a lookup table corresponding to the third word line group including the top word line. Referring to FIG. 8, for example, the third lookup table LUT3 may be a lookup table corresponds to the third word line group Group 3 including the first word line WL1 to the word line previous to the j-th word line WLj, for example the i-th word line WL1.

Each of the plurality of lookup tables LUT1 to LUT3 may include sum count reference ranges corresponding to the attribute of the write data.

For example, a first range Range1_1 included in the first lookup table LUT1 may be a range corresponding to the hot data, a second range Range1_2 included in the first lookup table LUT1 may be a range corresponding to the warm data, and a third range Range1_3 included in the first lookup table LUT1 may be a range corresponding to the cold data.

First to third ranges Range2_1 to Range2_3 included in the second lookup table LUT2 may sequentially correspond to the hot data, the warm data, and the cold data, respectively. Similarly, first to third ranges Range3_1 to Range3_3 included in the third lookup table LUT3 may also sequentially correspond to the hot data, the warm data, and the cold data.

In an embodiment, among the first to third lookup tables LUT1 to LUT3, the program voltage corresponding to the hot data included in the first lookup table LUT1 may be the least, and the program voltage corresponding to the hot data included in the third lookup table LUT3 may be the greatest. For example, among the first to third lookup tables LUT1 to LUT3, each of a first program start voltage Vstart1_1 and a first step voltage ΔV1_1 corresponding to the first range Range1_1 included in the first lookup table LUT1 may be the least, and each of a first program start voltage Vstart3_1 and a first step voltage ΔV3_1 corresponding to the first range Range3_1 included in the third lookup table LUT3 may be the greatest, This is for equalizing the overall program operation speed different according to the position of the word line.

In an embodiment, among the first to third lookup tables LUT1 to LUT3, the program voltage corresponding to the cold data included in the first lookup table LUT1 may be the greatest, and the program voltage corresponding to the cold data included in the third lookup table LUT3 may be the least. For example, among the first to third lookup tables LUT1 to LUT3, each of a third program start voltage Vstart1_3 and a third step voltage ΔV1_3 corresponding to the third range Range1_3 included in the first lookup table LUT1 may be the least, and each of a third program start voltage Vstart3_3 and a third step voltage ΔV3_3 corresponding to the third range Range3_3 included in the third lookup table LUT3 may be the greatest. This is for equalizing the overall program operation speed different according to the position of the word line.

In an embodiment, in each lookup table, the program voltage corresponding to the hot data may be the greatest and the program voltage corresponding to the cold data may be the least. For example, in the first lookup table LUT1, each of the first program start voltage Vstart1_1 and the first step voltage ΔV1_1 corresponding to the first range Range1_1 included in the first lookup table LUT1 may be the greatest, and each of the third program start voltage Vstart1_3 and the third step voltage ΔV1_3 corresponding to the third range Range1_3 included in the first lookup table LUT1 may be the least. The second lookup table LUT2 and the third lookup table LUT3 are also the same as those in the above-described example. This is for improving performance of the write operation for the write data, which is the hot data.

Figure 12:
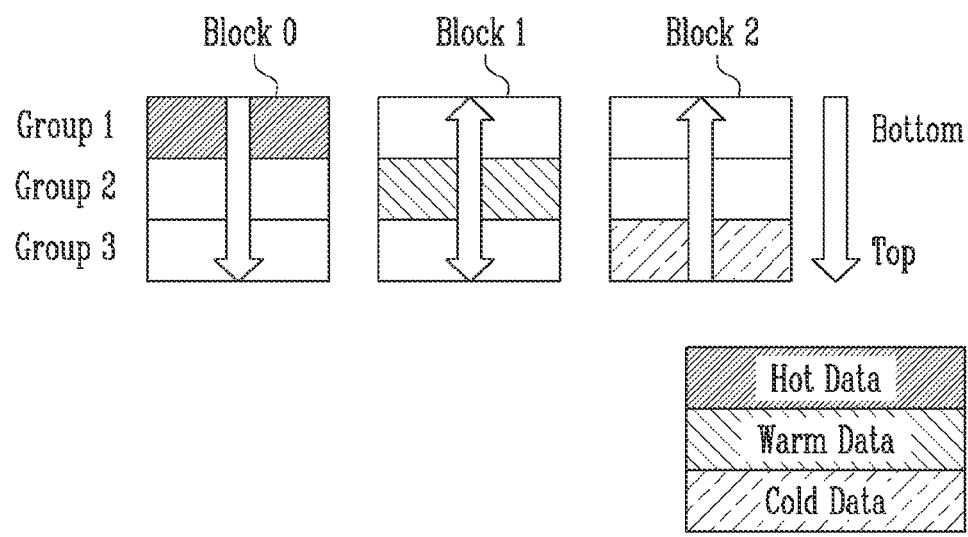
FIG. 12 is a diagram illustrating an order in which the program operation is performed on the plurality of word line groups included in the memory block according to an attribute of the write data.
Figure 13:
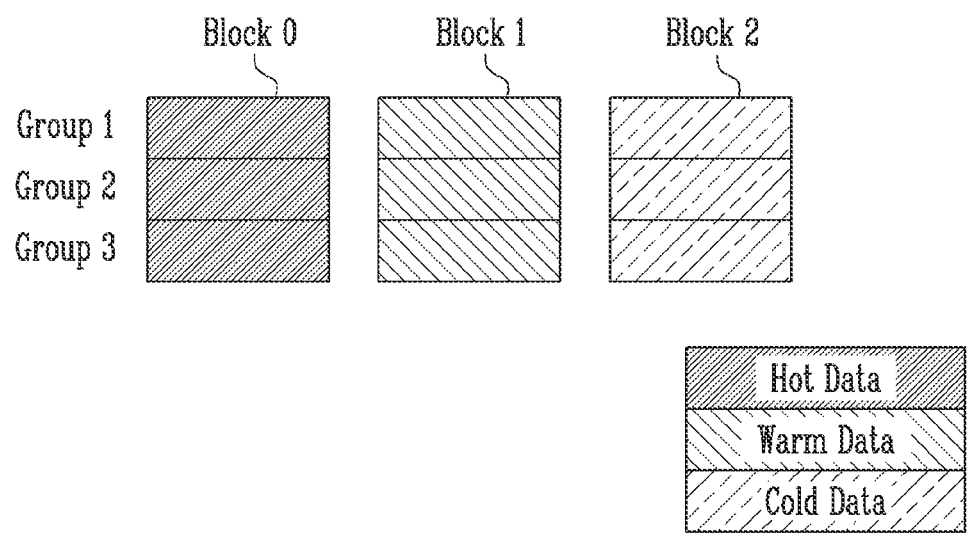
FIG. 13 is a diagram illustrating a plurality of memory blocks stored according to the attribute of the write data.

FIG. 12 is a diagram illustrating an order in which the program operation is performed on the plurality of word line groups included in the memory block according to the attribute of the write data, and FIG. 13 is a diagram illustrating a plurality of memory blocks stored according to the attribute of the write data.

Referring to FIG. 12, the memory controller 200 may determine an order in which the write data is stored in the memory block according to the attribute of the write data.

For example, when the attribute of the write data is the hot data, the program operation controller 202 may control the memory device 100 to store the write data in an order of the first word line group Group 1, the second word line group Group 2, and the third word line group Group 3 included in a memory block Block 0. For example, the program operation controller 202 may control the memory device 100 to first store the write data in the memory cells connected to the word lines included in the first word line group Group 1, store the write data in the memory cells connected to the word lines included in the second word line group Group 2, and store the write data in the memory cells connected to the word lines included in the third word line group Group 3.

For example, when the attribute of the write data is the warm data, the program operation controller 202 may first store the write data in the memory cells connected to the word lines included in the second word line group Group 2 included in the memory block Block 1. When all write data is stored in the memory cells connected to the word lines included in the second word line group Group 2, the program operation controller 202 may control the memory device 100 to store subsequent write data provided from the host 400 in the first word line group Group 1 and the third word line group Group 3. In this case, the subsequent write data may be stored in an order of the first word line group Group 1 and the third word line group Group 3, and may also be stored in an order of the third word line group Group 3 and the first word line group Group 1.

For example, when the attribute of the write data is the cold data, the program operation controller 202 may control the memory device 100 to store the write data in an order of the third word line group Group 3, the second word line group Group 2, and the first word line group Group 1 included in a memory block Block 2. For example, the program operation controller 202 may control the memory device 100 to first store the write data in the memory cells connected to the word lines included in the third word line group Group 3, store the write data in the memory cells connected to the word lines included in the second word line group Group 2, and store the write data in the memory cells connected to the word lines included in the first word line group Group 1.

Referring to FIG. 13, all write data having the attribute of the hot data may be stored in the same memory block Block 0, all write data having the attribute of the warm data may be stored in the same memory block Block 1, and all write data having the attribute of the cold data may be stored in the same memory block Block 2.

According to that described above, all write data having the same attribute may be stored in the same memory block. Therefore, the number of times the background operation such as garbage collection is performed is reduced. Thus, the performance of the storage device may be improved by reducing the number of times the background operation is performed.

Figure 14:
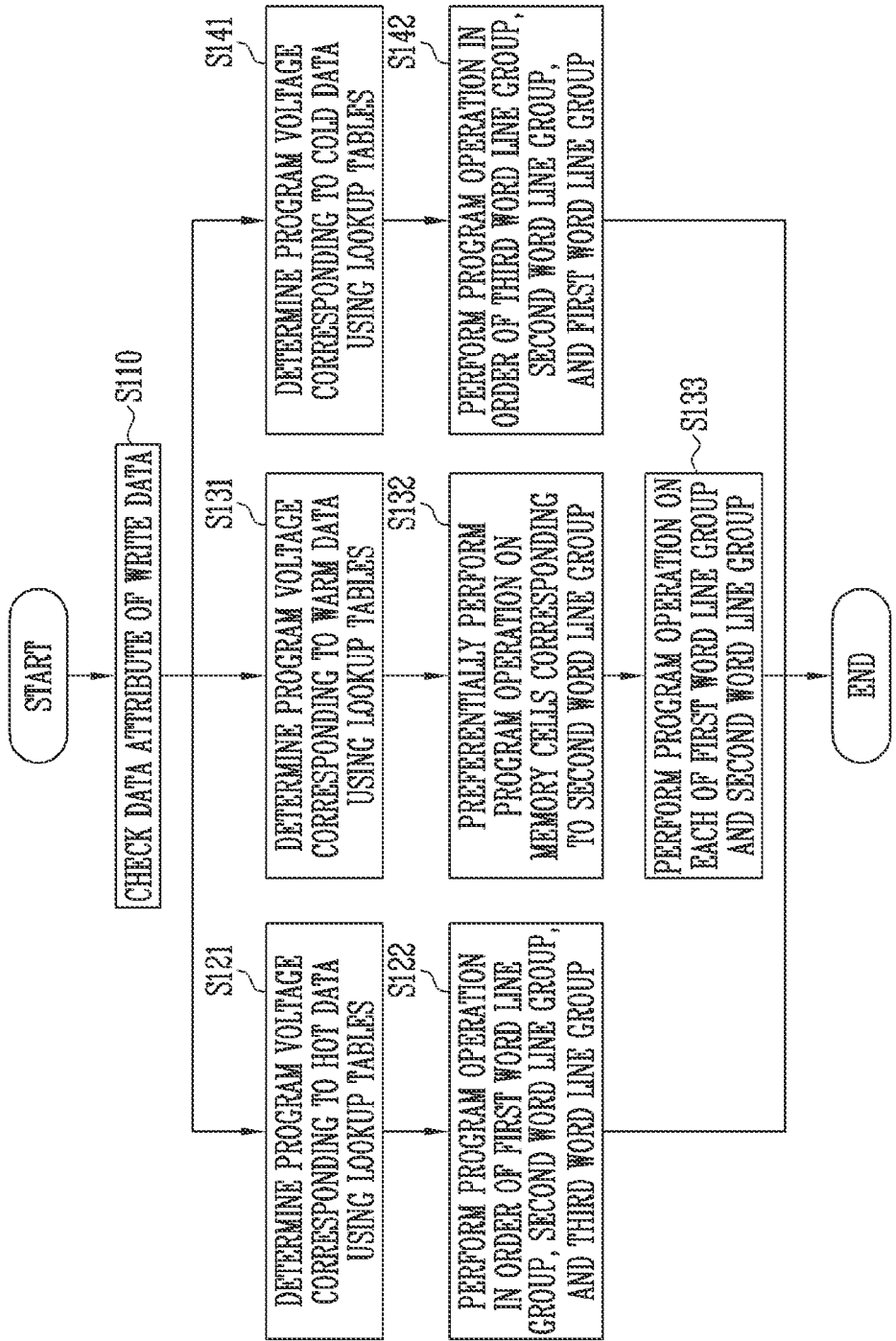
FIG. 14 is a flowchart illustrating a method of operating the storage device according to an embodiment of the present disclosure.

FIG. 14 is a flowchart illustrating a method of operating the storage device according to an embodiment of the present disclosure.

Referring to FIG. 14, the storage device 1000 may determine the attribute of the write data corresponding to the write request in response to the write request provided from the host 400 (S110).

The storage device 1000 may determine the program voltage corresponding to the attribute of the write data based on the plurality of lookup tables.

For example, when the attribute of the write data is the hot data, the storage device 1000 determines the program voltage corresponding to the hot data using the lookup tables (S121).

For example, when the attribute of the write data is the warm data, the storage device 1000 determines the program voltage corresponding to the warm data using the lookup tables (S131).

For example, when the attribute of the write data is the cold data, the storage device 1000 determines the program voltage corresponding to the cold data using the lookup tables (S141).

Here, each of the plurality of lookup tables may be a lookup table including the program information on the program voltage according to the attribute of the write data and the position of the plurality of word lines which are vertically stacked.

In an embodiment, the plurality of lookup tables may include the first lookup table corresponding to the first word line group including the bottom word line, the second lookup table corresponding to the second word line group including the middle word line existing between the bottom word line and the top word line, and the third lookup table corresponding to the third word line group including the top word line.

Here, the program voltage may include the program start voltage and the step voltage.

The storage device 1000 performs the program operation of storing the write data in the memory block according to the program voltage, Here, the memory block may include the plurality of memory cells respectively connected to the plurality of word lines.

For example, when the attribute of the write data Is the hot data, the storage device 1000 performs the program operation of storing the write data in the order of the first word line group, the second word line group, and the third word line group (S122).

For example, when the attribute of the write data is the warm data, the storage device 1000 preferentially performs the program operation on the memory cells corresponding to the second word line group (S132), and performs the program operation on each of the first word line group and the second word line group (S133). For example, the storage device 1000 may control the memory device 100 to first store the write data in the memory cells connected to the word lines included in the second word line group and then store the subsequent write data provided from the host 400 in the first word line group and the third word line group.

For example, when the attribute of the write data is the cold data, the storage device 1000 performs the program operation of storing the write data in the order of the third word line group, the second word line group, and the first word line group (S142).

Figure 15:
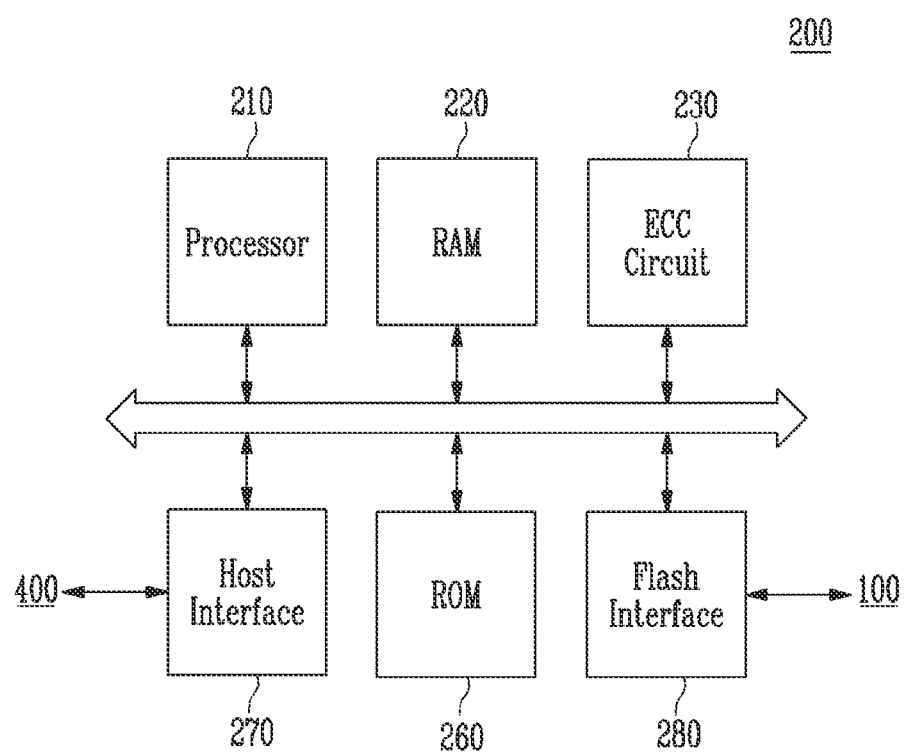
FIG. 15 is a diagram illustrating the memory controller according to an embodiment of the present disclosure.

FIG. 15 is a diagram illustrating the memory controller according to an embodiment of the present disclosure.

Referring to FIGS. 1 and 15, the memory controller 200 may include a processor 210, a RAM 220, an error correction circuit 230, a ROM 260, a host interface 270, and a flash interface 280.

The processor 210 may control an overall operation of the memory controller 200.

The RAM 220 may be used as a buffer memory, a cache memory, an operation memory, and the like of the memory controller 200. For example, the RAM 202 may be a buffer memory, and in an embodiment, the RAM 202 may be an SRAM.

The ROM 260 may store various information required for the memory controller 200 to operate in a firmware form.

The memory controller 200 may communicate with an external device (for example, the host 400, an application processor, and the like) through the host interface 270.

The memory controller 200 may communicate with the memory device 100 through the flash interface 280. The memory controller 200 may transmit a command CMD, an address ADDR, a control signal CTRL, and the like to the memory device 100 and receive data DATA through the flash interface 280.

Figure 16:
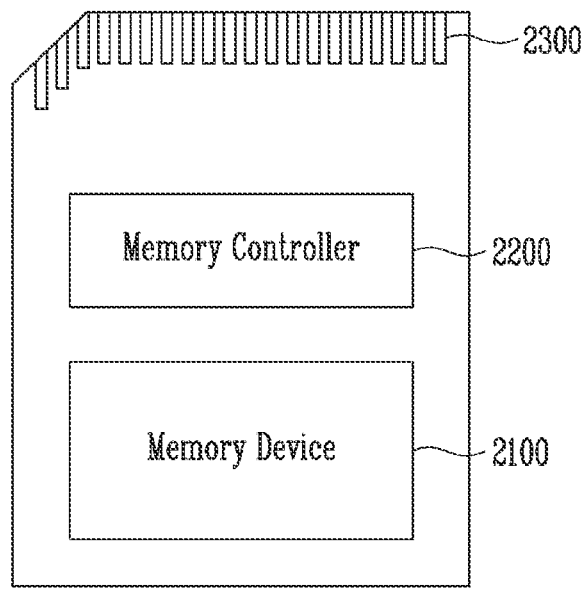
FIG. 16 is a diagram illustrating a memory card system to which the storage device according to an embodiment of the present disclosure is applied.

For example, the flash interface 280 may include a NAND interface,

FIG. 16 is a diagram illustrating a memory card system to which the storage device according to an embodiment of the present disclosure is applied.

Referring to FIGS. 1 and 16, the memory card system 2000 includes a memory device 2100, a memory controller 2200, and a connector 2300.

For example, the memory device 2100 may be configured of various non-volatile memory elements such as an electrically erasable and programmable ROM (EEPROM), a NAND flash memory, a NOR flash memory, a phase-change RAM (PRAM), a resistive RAM (ReRAM), a ferroelectric RAM (FRAM), and a spin-transfer torque magnetic RAM (STT-MRAM).

The memory controller 2200 is connected to the memory device 2100. The memory controller 2200 is configured to access the memory device 2100. For example, the memory controller 2200 may be configured to control read, write, erase, and background operations of the memory device 2100. The memory controller 2200 is configured to provide an interface between the memory device 2100 and the host 400. The memory controller 2200 is configured to drive firmware for controlling the memory device 2100. The memory controller 2200 may be implemented equally to the memory controller 200 described with reference to FIG. 1.

For example, the memory controller 2200 may include components such as a random access memory (RAM), a processor, a host interface, a memory interface, and an error correction circuit.

The memory controller 2200 may communicate with an external device through the connector 2300. The memory controller 2200 may communicate with an external device (for example, the host 400) according to a specific communication standard. For example, the memory controller 2200 is configured to communicate with an external device through at least one of various communication standards such as a universal serial bus (USB), a multimedia card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe. For example, the connector 2300 may be defined by at least one of the various communication standards described above.

The memory device 2100 and the memory controller 2200 may be integrated into one semiconductor device to configure a memory card. For example, the memory controller 2200 and the memory device 2100 may be integrated into one semiconductor device to configure a memory card such as a PC card (personal computer memory card international association (PCMCIA)), a compact flash card, a smart media card (SM or SMC), a memory stick, a multimedia card (MMC, RS-MMC, MMCmicro, or eMMC), an SD card (SD, miniSD, microSD, or SDHC), and a universal flash storage (UFS).

Figure 17:
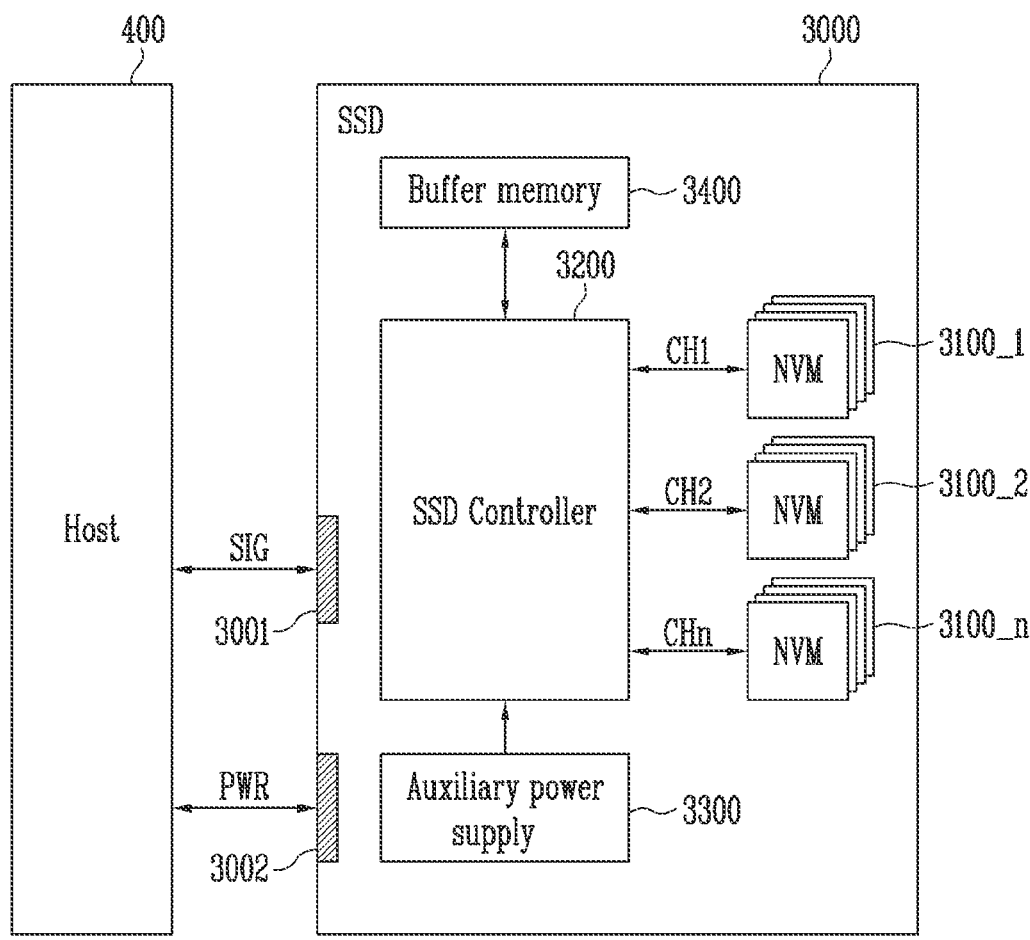
FIG. 17 is a diagram illustrating a solid state drive (SSD) system to which the storage device according to an embodiment of the present disclosure is applied.

FIG. 17 is a diagram illustrating a solid state drive (SSD) system to which the storage device according to an embodiment of the present disclosure is applied.

Referring to FIGS. 1 and 17, the SSD system includes the host 400 and an SSD 3000.

The SSD 3000 exchanges a signal SIG with the host 400 through a signal connector 3001 and receives power PWR through a power connector 3002. The SSD 3000 includes an SSD controller 3200, a plurality of flash memories 3100_1, 3100_2, and 3100_n, an auxiliary power device 3300, and a buffer memory 3400.

According to an embodiment of the present disclosure, the SSD controller 3200 may perform the function of the memory controller 200 described with reference to FIG. 1.

The SSD controller 3200 may control the plurality of flash memories 3100_1, 3100_2, and 3100_n in response to the signal SIG received from the host 400. For example, the signal SIG may be signals based on an interface between the host 400 and the SSD 3000. For example, the signal SIG may be a signal defined by at least one of interfaces such as a universal serial bus (USB), a multimedia card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe.

The auxiliary power device 3300 is connected to the host 400 through the power connector 3002. The auxiliary power device 3300 may receive the power PWR from the host 400 and may charge the power. The auxiliary power device 3300 may provide power of the SSD 3000 when power supply from the host 400 is not smooth. For example, the auxiliary power device 3300 may be positioned in the SSD 3000 or may be positioned outside the SSD 3000. For example, the auxiliary power device 3300 may be positioned on a main board and may provide auxiliary power to the SSD 3000.

The buffer memory 3400 may temporarily store data. For example, the buffer memory 3400 may temporarily store data received from the host 400 or data received from the plurality of flash memories 3100_1, 3100_2, and 3100_n, or may temporarily store meta data (for example, a mapping table) of the flash memories 3100_1, 3100_2, and 3100_n. The buffer memory 3400 may include a volatile memory such as a DRAM, an SDRAM, a DDR SDRAM, an LPDDR SDRAM, and a GRAM, or a nonvolatile memory such as an FRAM, a ReRAM, and an STT-MRAM.

Figure 18:
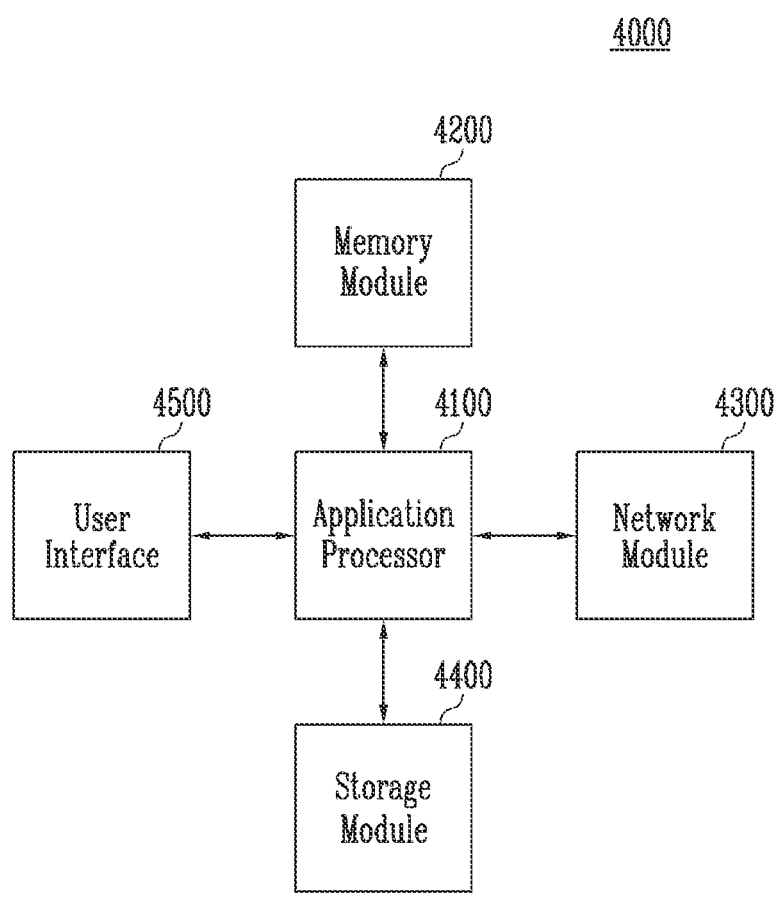
FIG. 18 is a diagram illustrating a user system to which the storage device according to an embodiment of the present disclosure is applied.

FIG. 18 is a diagram illustrating a user system to which the storage device according to an embodiment of the present disclosure is applied.

Referring to FIG. 18, the user system 4000 includes an application processor 4100, a memory module 4200, a network module 4300, a storage module 4400, and a use interface 4500.

The application processor 4100 may drive components, an operating system (OS), a user program, or the like included in the user system 4000. For example, the application processor 4100 may include controllers, interfaces, graphics engines, and the like that control the components included in the user system 4000, The application processor 4100 may be provided as a system-on-chip (SoC).

The memory module 4200 may operate as a main memory, an operation memory, a buffer memory, or a cache memory of the user system 4000. The memory module 4200 may include a volatile random access memory such as a DRAM, an SDRAM, a DDR SDRAM, a DDR2 SDRAM, a DDR3 SDRAM, an LPDDR SDARM, an LPDDR2 SDRAM, and an LPDDR3 SDRAM, or a non-volatile random access memory, such as a PRAM, a ReRAM, an MRAM, and an FRAM, For example, the application processor 4100 and memory module 4200 may be packaged based on a package on package (POP) and provided as one semiconductor package.

The network module 4300 may communicate with external devices. For example, the network module 4300 may support wireless communication such as code division multiple access (CDMA), global system for mobile communications (GSM), wideband CDMA (WCDMA), CDMA-2000, time division multiple access (TDMA), long term evolution, Wimax, WLAN, UWB, Bluetooth, and Wi-Fi. For example, the network module 4300 may be included in the application processor 4100.

The storage module 4400 may store data. For example, the storage module 4400 may store data received from the application processor 4100. Alternatively, the storage module 4400 may transmit data stored in the storage module 4400 to the application processor 4100. For example, the storage module 4400 may be implemented with a non-volatile semiconductor memory element such as a phase-change RAM (PRAM), a magnetic RAM (MRAM), a resistive RAM (RRAM), a NAND flash, a NOR flash, and a three-dimensional NAND flash. For example, the storage module 4400 may be provided as a removable storage device (removable drive), such as a memory card, and an external drive of the user system 4000.

For example, the storage module 4400 may operate identically to the storage device 1000 described with reference to FIG. 1, The storage module 4400 may include a plurality of non-volatile memory devices, and the plurality of non-volatile memory devices may operate identically to the memory device 100 described with reference to FIG. 1.

The user interface 4500 may include interfaces for inputting data or an instruction to the application processor 4100 or for outputting data to an external device. For example, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric element. The user interface 4500 may include user output interfaces such as a liquid crystal display (LCD), an organic light emitting diode (OLED) display device, an active matrix OLED (AMOLED) display device, an LED, a speaker, and a monitor.

As described above, according to the embodiments of the present disclosure, all write data having the same attribute are stored in the same memory block. Therefore, the number of times a merge operation, garbage collection, or the like is performed may be reduced, and the performance of the storage device may be improved.

What is claimed is:

1. A storage device comprising:
    a memory device including a plurality of memory blocks including a plurality of memory cells respectively connected to a plurality of word lines which are vertically stacked; and
    a memory controller configured to control the memory device to determine an attribute of a plurality of write data corresponding to a write request in response to the write request provided from a host, set a program voltage used for a program operation of storing write data having the same attribute of the write data among the plurality of write data in the same memory block based on a lookup table including the attribute of the write data and program information on the program voltage according to positions of the plurality of word lines which are vertically stacked, and perform the program operation according to the set program voltage.

2. The storage device of claim 1, wherein the memory controller comprises:
    a program information storage configured to store the lookup table; and
    a program operation controller configured to control the memory device to set the program voltage from the program information corresponding to the attribute of the write data using the lookup table and apply the program voltage to a selected word line among the plurality of word lines.

3. The storage device of claim 2, wherein the memory device includes a program voltage register that stores a plurality of lookup tables respectively corresponding to a plurality of word line groups divided based on the positions of the plurality of word lines.

4. The storage device of claim 3, wherein the plurality of lookup tables comprise:
    a first lookup table corresponding to a first word line group including a bottom word line disposed at a lowermost position among the plurality of word lines;

a second lookup table corresponding to a second word line group including a middle word line existing between the bottom word line and a top word line disposed at an uppermost position among the plurality of word lines; and a third lookup table corresponding to a third word line group including the top word line among the plurality of word lines, and the attribute of the write data is any one of hot data, warm data, and cold data.

5. The storage device of claim 4, wherein among the first to third lookup tables, the program voltage corresponding to the hot data included in the first lookup table is the least, and the program voltage corresponding to the hot data included in the third lookup table is the greatest.

6. The storage device of claim 5, wherein the attribute of the write data is the hot data, and the program operation controller controls the memory device to store the write data in memory cells respectively connected to the first to third word line groups in an order of the first word line group, the second word line group, and the third word line group.

7. The storage device of claim 4, wherein among the first to third lookup tables, the program voltage corresponding to the cold data included in the first lookup table is the greatest, and the program voltage corresponding to the cold data included in the third lookup table is the least.

8. The storage device of claim 7, wherein the attribute of the write data is the cold data, and the program operation controller controls the memory device to store the write data in memory cells respectively connected to the first to third word line groups in an order of the third word line group, the second word line group, and the first word line group.

9. The storage device of claim 4, wherein the attribute of the write data is the warm data, and the program operation controller controls the memory device to first store the write data in memory cells connected to the second word line group.

10. The storage device of claim 1, wherein the plurality of memory blocks includes a first memory block, a second memory block, and a third memory block, the attribute of the write data is any one of hot data, warm data, and cold data, the write data of which the attribute of the write data is the hot data among the plurality of write data is stored in the first memory block, the write data of which the attribute of the write data is the warm data among the plurality of write data is stored in the second memory block, and the write data of which the attribute of the write data is the cold data among the plurality of write data is stored in the third memory block.

11. The storage device of claim 1, wherein the program information includes a program start voltage that is a program voltage applied to a selected word line among the plurality of word lines in an initial program loop among a plurality of program loops included in the program operation, and a step voltage corresponding to an increase amount of the program voltage as a program loop is repeated.

12. The storage device of claim 1, wherein the memory controller determines the attribute of the write data as any one of hot data, warm data, and cold data using seed data included in the write data.

13. A method of operating a storage device, the method comprising:

determining an attribute of write data corresponding to a write request in response to the write request provided from a host;

determining a program voltage corresponding to the attribute of the write data based on a plurality of lookup tables including the attribute of the write data and program information on a program voltage according to positions of a plurality of word lines which are vertically stacked; and performing a program operation of storing the write data in a memory block including a plurality of memory cells respectively connected to the plurality of word lines according to the program voltage.

14. The method of claim 13, wherein the plurality of lookup tables comprise:

a first lookup table corresponding to a first word line group including a bottom word line disposed at a lowermost position among the plurality of word lines;

a second lookup table corresponding to a second word line group including a middle word line existing between the bottom word line and a top word line disposed at an uppermost position among the plurality of word lines; and a third lookup table corresponding to a third word line group including the top word line among the plurality of word lines, and the attribute of the write data is any one of hot data, warm data, and cold data.

15. The method of claim 14, wherein among the first to third lookup tables, the program voltage corresponding to the hot data included in the first lookup table is the least, and the program voltage corresponding to the hot data included in the third lookup table is the greatest.

16. The method of claim 15, wherein the attribute of the write data is the hot data, and performing the program operation comprises storing the write data in memory cells respectively connected to first to third word line groups in an order of the first word line group, the second word line group, and the third word line group.

17. The method of claim 14, wherein among the first to third lookup tables, the program voltage corresponding to the cold data included in the first lookup table is the greatest, and the program voltage corresponding to the cold data included in the third lookup table is the least.

18. The method of claim 17, wherein the attribute of the write data is the cold data, and performing the program operation comprises storing the write data in memory cells respectively connected to first to third word line groups in an order of the third word line group, the second word line group, and the first word line group.

19. The method of claim 14, wherein the attribute of the write data is the warm data, and performing the program operation comprises:

first storing the write data in memory cells connected to the second word line group; and storing subsequent write data provided from the host in the first word line group and the third word line group.

20. The method of claim 13, wherein determining the attribute of the write data comprises determining the attribute of the write data as any one of hot data, warm data, and cold data using seed data included in the write data.

* * * * *